United States Patent
Yanagida

(10) Patent No.: US 11,064,638 B2
(45) Date of Patent: Jul. 13, 2021

(54) COMPONENT SUPPLY DEVICE, SURFACE-MOUNTING MACHINE, AND COMPONENT SUPPLY METHOD

(71) Applicant: Yamaha Hatsudoki Kabushiki Kaisha, Iwata (JP)

(72) Inventor: Tsutomu Yanagida, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 170 days.

(21) Appl. No.: 16/348,074

(22) PCT Filed: Nov. 10, 2016

(86) PCT No.: PCT/JP2016/083338
§ 371 (c)(1),
(2) Date: May 7, 2019

(87) PCT Pub. No.: WO2018/087857
PCT Pub. Date: May 17, 2018

(65) Prior Publication Data
US 2019/0364704 A1 Nov. 28, 2019

(51) Int. Cl.
H05K 13/02 (2006.01)
H05K 13/04 (2006.01)

(52) U.S. Cl.
CPC ..... *H05K 13/0215* (2018.08); *H05K 13/0419* (2018.08)

(58) Field of Classification Search
CPC .................. H05K 13/0215; H05K 13/0419
See application file for complete search history.

(56) References Cited

U.S. PATENT DOCUMENTS 5,299,902 A * 4/1994 Fujiwara ............ H05K 13/0419
414/416.01
6,887,330 B2 * 5/2005 Onoshiro ........... H05K 13/0417
156/159

(Continued)

FOREIGN PATENT DOCUMENTS

JP 2014-011328 A 1/2014
JP 2015-032622 A 2/2015
KR 10-2010-0084748 A 7/2010

OTHER PUBLICATIONS

An Office Action mailed by the Korean Patent Office dated Sep. 14, 2020, which corresponds to Korean Patent Application 10-2019-7010427 and is related to U.S. Appl. No. 16/348,074 with English language translation.

(Continued)

*Primary Examiner* — Carl J Arbes
(74) *Attorney, Agent, or Firm* — Studebaker & Brackett PC

(57) ABSTRACT

A component supply device is a feeder which uses a supply tape to supply an electronic component, and includes a main carrier route for carrying the supply tape to a component suction position, a first carrier route for carrying the supply tape from a tape insertion position to a rear end part of the main carrier route, a second carrier route provided so as to be aligned below the first carrier route, a second sprocket which carries the supply tape to the component suction position, a third sprocket which carries the supply tape from the tape insertion position to the second sprocket, and a route switching device provided to a loading unit which automatically changes a carrier route of the supply tape from the first carrier route to the second carrier route when the supply tape is carried to the component suction position.

11 Claims, 21 Drawing Sheets

(56) References Cited

U.S. PATENT DOCUMENTS

| | | | | |
|---|---|---|---|---|
| 9,055,709 | B2* | 6/2015 | Shin | H05K 13/0417 |
| 9,137,936 | B2* | 9/2015 | Katsumi | H05K 13/0419 |
| 9,522,801 | B2* | 12/2016 | Kanai | H05K 13/0215 |
| 9,580,264 | B2* | 2/2017 | Yamasaki | B65H 20/20 |
| 9,592,986 | B2* | 3/2017 | Kitani | H05K 13/0419 |
| 9,611,114 | B2* | 4/2017 | Shimizu | B65H 20/20 |
| 9,974,218 | B2* | 5/2018 | Tanokuchi | H05K 13/021 |
| 2010/0180435 | A1 | 7/2010 | Shin et al. | |
| 2017/0251578 | A1* | 8/2017 | Takata | H05K 13/0419 |

OTHER PUBLICATIONS

International Search Report issued in PCT/JP2016/083338; dated Feb. 14, 2017.

An Office Action mailed by the Chinese Patent Office dated Mar. 23, 2020, which corresponds to Chinese Patent Application No. 201680090100.5 and is related to U.S. Appl. No. 16/348,074.

An Office Action mailed by the Japanese Patent Office dated Mar. 26, 2020, which corresponds to Japanese Patent Application No. 2018-549689 with English translation.

* cited by examiner

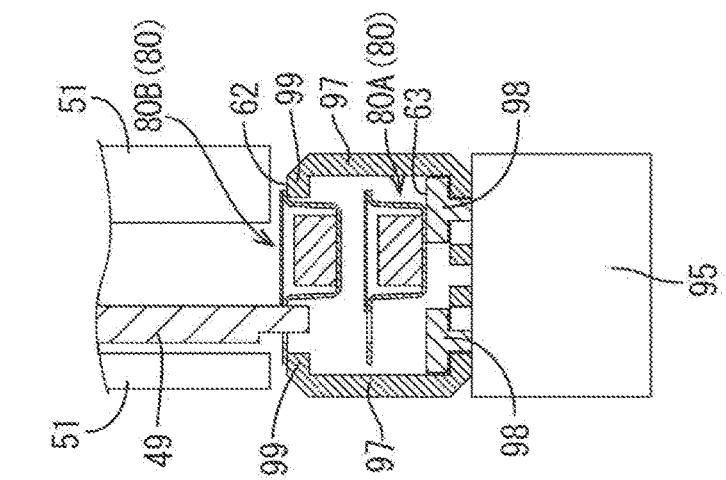
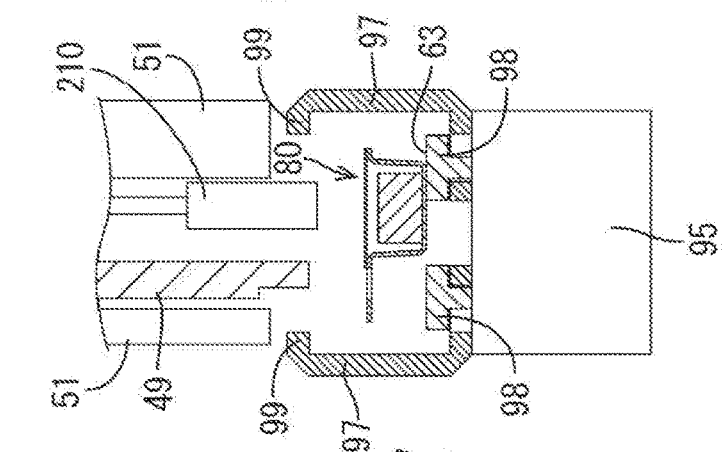
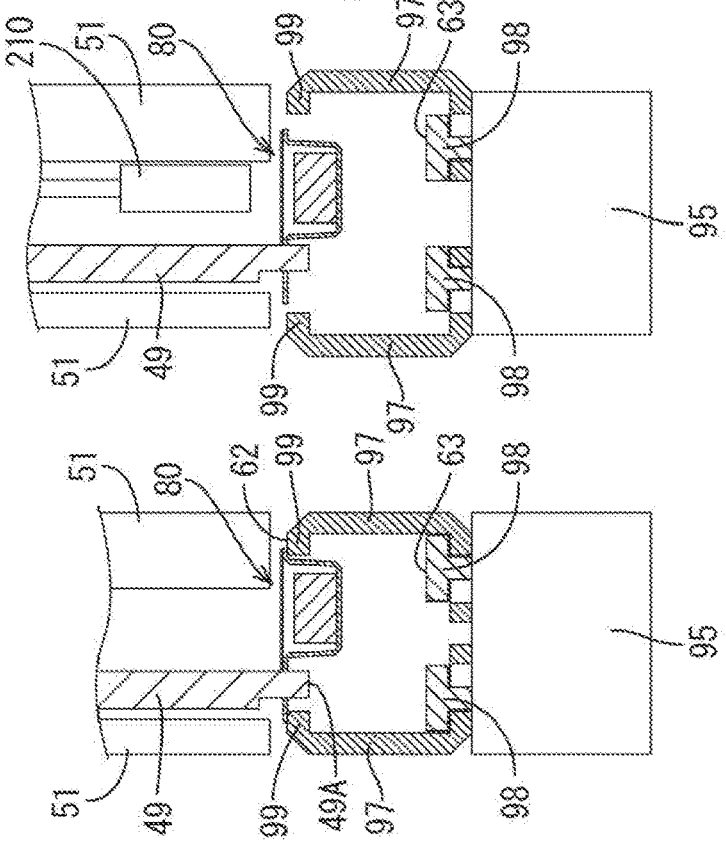

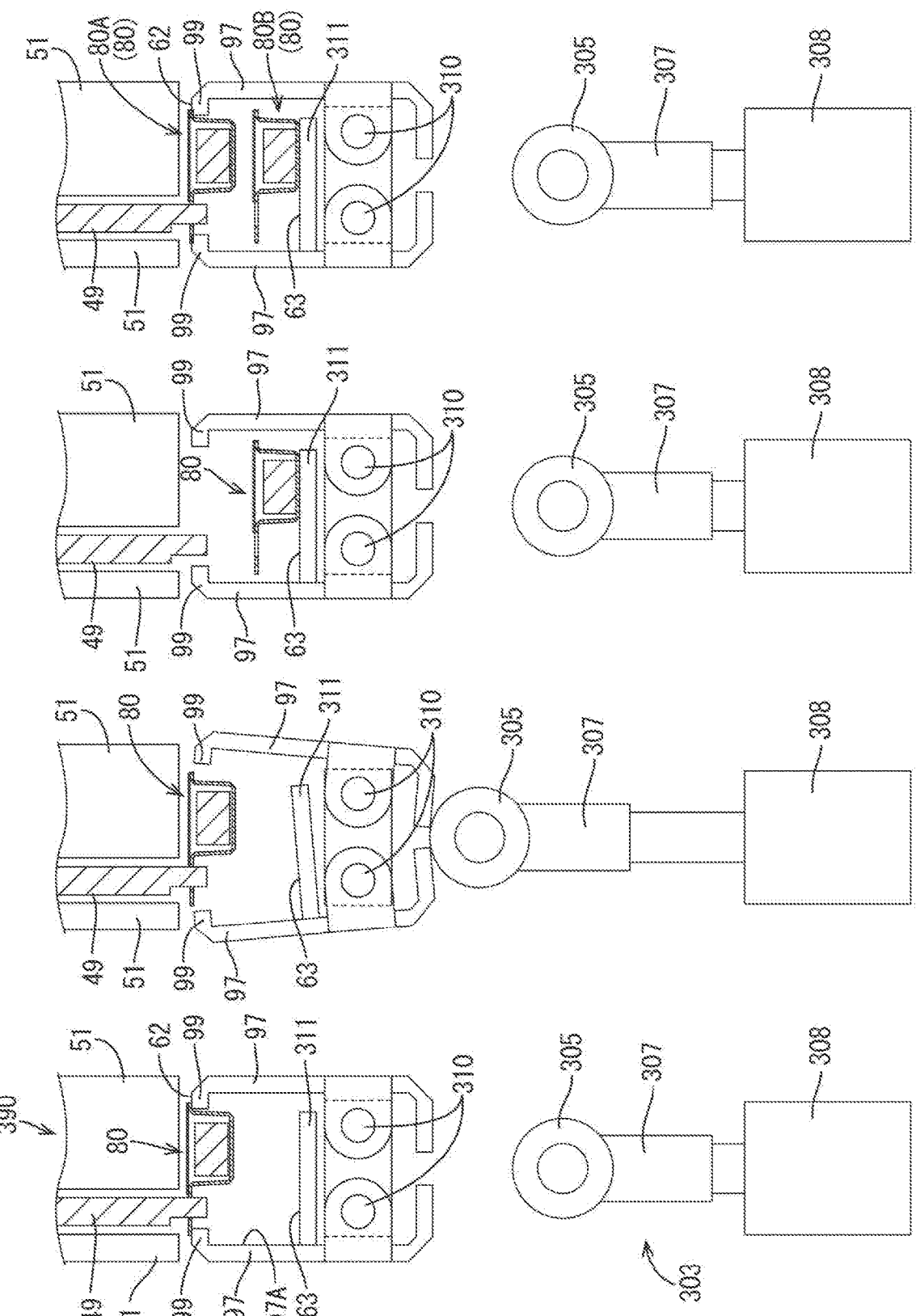

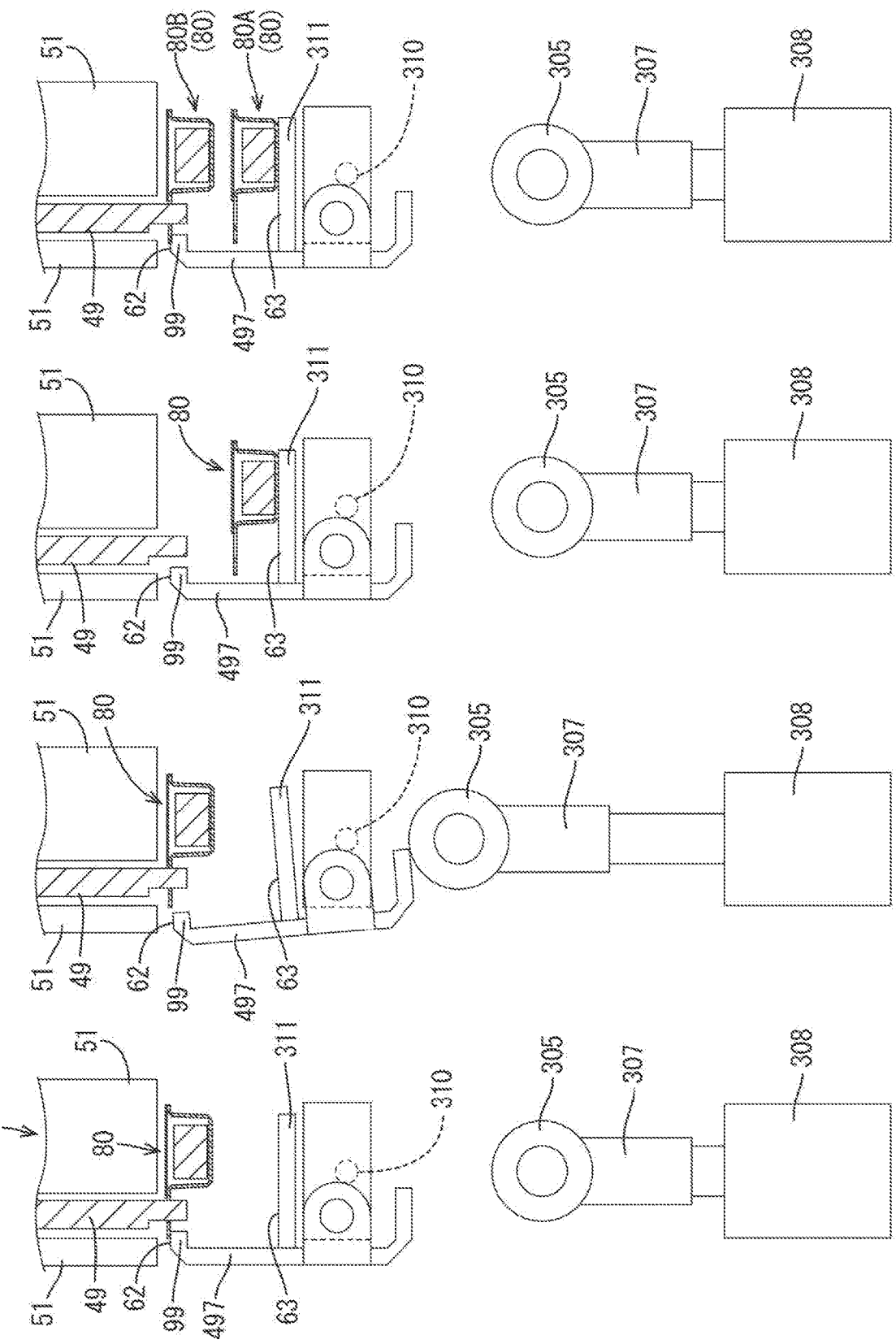

COMPONENT SUPPLY DEVICE, SURFACE-MOUNTING MACHINE, AND COMPONENT SUPPLY METHOD

This application is a National Stage of International Patent Application No. PCT/JP2016/083338, filed Nov. 10, 2016, the entire content of which is incorporated herein by reference.

BACKGROUND

Technical Field

The technology disclosed by the specification relates to a component supply device, surface-mounting machine, and component supply method.

Background Art

For example, as a surface-mounting machine having a component supply device which supplies an electronic component, one described in Japanese Unexamined Patent Application Publication No. 2014-11328 has been known. The component supply device has a plurality of tape feeders. In each tape feeder, a supply tape for holding electronic components is sent out to a component supply position, thereby supplying the electronic components. Then, before depletion of the supply tape, a worker removes a tape retaining plate to lift a portion in midstream of a preceding tape, which is a preceding supply tape, to change the carrier route of the preceding tape onto the tape retaining plate. Then, the worker sets a subsequent tape, which is a subsequent supply tape, at a tape insertion position arranged below the tape retaining plate. When the preceding tape is discharged, the subsequent tape is automatically loaded to the component supply position.

SUMMARY

In this component supply device, to set the subsequent tape, after checking that the supply tape has been loaded, the worker has to change the carrier route of the preceding tape. Moreover, when the supply tape is replaced in a plurality of tape feeders, a new supply tape cannot be set until loading is completed, and the work of the worker becomes burdensome, including removal of the tape retaining plate.

In the specification, technology for making tape replacement work efficient is disclosed.

The technology disclosed by the specification is directed to a component supply device which uses a supply tape for accommodating a component to supply the component.

The component supply device includes a main carrier route for carrying the supply tape to a component suction position where the component is suctioned, a first carrier route for carrying the supply tape from a tape insertion position where the supply tape is inserted to an upstream end part of the main carrier route in a carrying direction, and a second carrier route provided so as to be aligned with the first carrier route in a thickness direction of the supply tape so as to connect to the upstream end part of the main carrier route in the carrying direction. The component supply device further includes first carrier means provided to the main carrier route to carry the supply tape to the component suction position, second carrier means provided to the first carrier route to carry the supply tape from the tape insertion position to the first carrier means, and tape route automatic change means which automatically changes a carrier route of the supply tape to the first carrier route to the second carrier route after the supply tape is carried by the second carrier means to at least the first carrier means.

The technology disclosed by the specification is also directed to a surface-mounting machine, and the machine is configured to include a base, the component supply device, a carrying device which carries a substrate to a component mounting position provided to the base, and a component mounting device which mounts the component supplied from the component suction position to the substrate arranged at the component mounting position.

The technology disclosed by the specification is also directed to a component supply method of a component supply device which uses a supply tape for accommodating a component to supply the component. The component supply device includes a main carrier route for carrying the supply tape to a component suction position where the component is supplied, a first carrier route for carrying the supply tape from a tape insertion position where the supply tape is inserted to an upstream end part of the main carrier route in a carrying direction, and a second carrier route provided so as to be aligned with the first carrier route in a thickness direction of the supply tape so as to connect to the upstream end part of the main carrier route in the carrying direction. The component supply device further includes first carrier means provided to the main carrier route to carry the supply tape to the component suction position, and second carrier means provided to the first carrier route to carry the supply tape from the tape insertion position to the first carrier means, and the method is configured to perform a tape route automatic change process of automatically changing a carrier route of the supply tape to the first carrier route to the second carrier route after the supply tape is carried by the second carrier means to at least the first carrier means.

According to the above-structured component supply device and component supply method, the carrier route of the supply tape is automatically changed from the first carrier route to the second carrier route after the supply tape is carried downstream of the position of the first carrier means in the carrying direction on the main carrier route. Thus, the worker is not required to perform change work of changing the carrier route of the supply tape after waiting completion of loading with the supply tape carried to the component suction position. With the fact that the first carrier route is vacant, a new supply tape can be set at the tape insertion position. This can make tape replacement work efficient and reduce work load on the worker.

The technology disclosed by the specification may have the following structures. The structure may be such that the first carrier means has a driving mechanism and a detection unit arranged downstream of the driving mechanism in the carrying direction to detect presence or absence of the supply tape and the tape route automatic change means automatically changes the carrier route of the supply tape to the first carrier route to the second carrier route after it is detected by the detection unit that the supply tape is present. The structure may be such that a plurality of said driving mechanisms are provided to the first carrier means and the detection unit is provided downstream of an upstream driving mechanism of the plurality of driving mechanisms in the carrying direction.

According to this structure, the supply tape is changed from the first carrier route to the second carrier route after the supply tape is detected by the detection unit of the first carrier means. Thus, the supply tape can be inhibited from being changed from the first carrier route to the second carrier route before the supply tape is carried to the first carrier means.

The structure may be such that the second carrier means stops after carrying of the supply tape by the first carrier means starts and the tape route automatic change means automatically changes the supply tape to the first carrier route to the second carrier route after the second carrier means stops.

According to this structure, since the second carrier means stops, the supply tape can be inhibited from being difficult to be changed from the first carrier route to the second carrier route because, for example, the supply tape is caught in the second carrier means being activated.

The structure may be such that the second carrier route is arranged below the first carrier route, the tape route automatic change means has a tape support unit provided so as to be able to be displaced between a support position for supporting the supply tape from below in the first carrier route and a retreat position retreated from the first carrier route, and with the tape support unit being displaced from the support position to the retreat position, the supply tape automatically moves from the first carrier route to the second carrier route.

According to this structure, only by displacing the tape support unit from the support position to the retreat position, the supply tape can be automatically changed from the first carrier route to the second carrier route by the self-weight. Thus, compared with a case in which the worker lifts a portion in midstream of the supply tape to change the carrier route of the supply tape, the tape route automatic change means can be configured as being simple and compact.

The structure may be such that said tape support units are arranged in a pair in a state of being spaced at the support position in a width direction so as to support both side edge parts of the supply tape in the width direction from below and the tape route automatic change means has a pressure driving unit which pressurizes the paired tape support units to displace the paired tape support units to the retreat position so that a width space between the paired tape support units is wider than a width dimension of the supply tape.

According to this structure, only by pressurizing the paired tape support units by the pressure driving unit to displace the tape support units to the retreat position, the worker can automatically and easily change the supply tape from the first carrier route to the second carrier route without work. Also, for example, compared with a case in which the tape support units which support the entire lower portion of the supply tape is displaced to the width direction, the displacement amount of the entire tape support units to the width direction can be decreased, and thus the tape route automatic change means can be configured as being compact.

The structure may be such that, between the paired tape support units, a pressing member is provided which presses the paired tape support units from the retreat position to the support position. According to this structure, the paired tape support units are pressed by the pressing member to the support position to be returned from the retreat position to the support position. Thus, the tape route automatic change means can be inhibited from becoming large.

The structure may be such that the tape support unit rotates by taking a rotation shaft extending in the carrying direction of the supply tape as a axial center to be able to be displaced between the support position and the retreat position and the tape route automatic change means has a pressure driving unit which pressurizes the tape support unit to rotate the tape support unit to cause the tape support unit to be displaced from the support position to the retreat position.

According to this structure, only by pressurizing the tape support unit by the pressure driving unit to rotate and displace the tape support unit to the retreat position, the supply tape can be automatically and easily changed from the first carrier route to the second carrier route without the worker performing work.

According to the technology disclosed by the specification, tape replacement work can be made efficient.

BRIEF DESCRIPTION OF THE DRAWINGS

FIGS. 19A to 19D are sectional views of a loading unit according to a second embodiment, corresponding to FIGS. 13A to 13D;

FIGS. 20A to 20D are sectional views of a loading unit according to a third embodiment, corresponding to FIGS. 13A to 13D; and FIGS. 21A to 21D are a sectional views of a loading unit according to a fourth embodiment, corresponding to FIGS. 13A to 13D.

BEST MODE FOR CARRYING OUT THE INVENTION

First Embodiment

A first embodiment in the technology disclosed in the specification is described with reference to FIG. 1 to FIG. 16.

The present embodiment exemplarily depicts a surface-mounting machine 10 which mounts an electronic component (one example of a "component") E on a printed circuit board (one example of a "substrate") P. The surface-mounting machine 10 is configured to include, as depicted in FIG. 1, a base 11 having a substantially rectangular shape in a planar view, a carrier conveyer (one example of a "carrier device") 12 which carries the printed circuit board P onto the base 11, a component mounting device 20 for mounting the electronic component E on the printed circuit board P, and component supply units 13 for supplying the electronic component E on the component mounting device 20.

Figure 3:
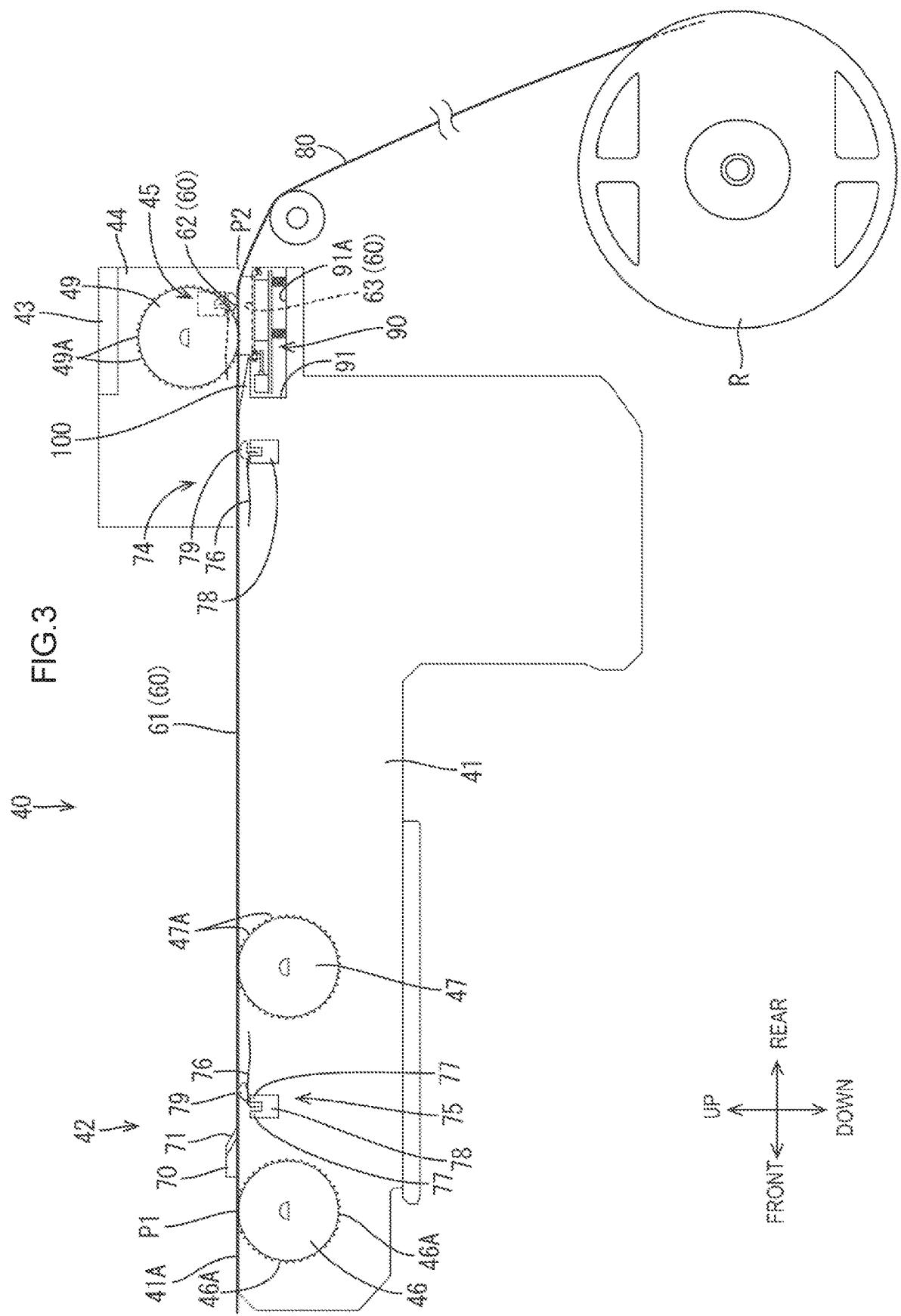
FIG. 3 is a side view of a feeder, depicting a state immediately after a supply tape is carried to a loading completion position.

In the following description, a lateral direction is with reference to a lateral direction in FIG. 1 (a long-side direction of the base 11 and a carrying direction of the carrier conveyer 12) and a lateral direction in FIGS. 11A to 11D. A front-and-back direction is with reference to a vertical direction in FIG. 1 (a short-side direction of the base 11) and a lateral direction of FIG. 3. In FIG. 3, description is made with a left side in the drawing taken as a front side and a right side in the drawing taken as a rear side.

Figure 1:
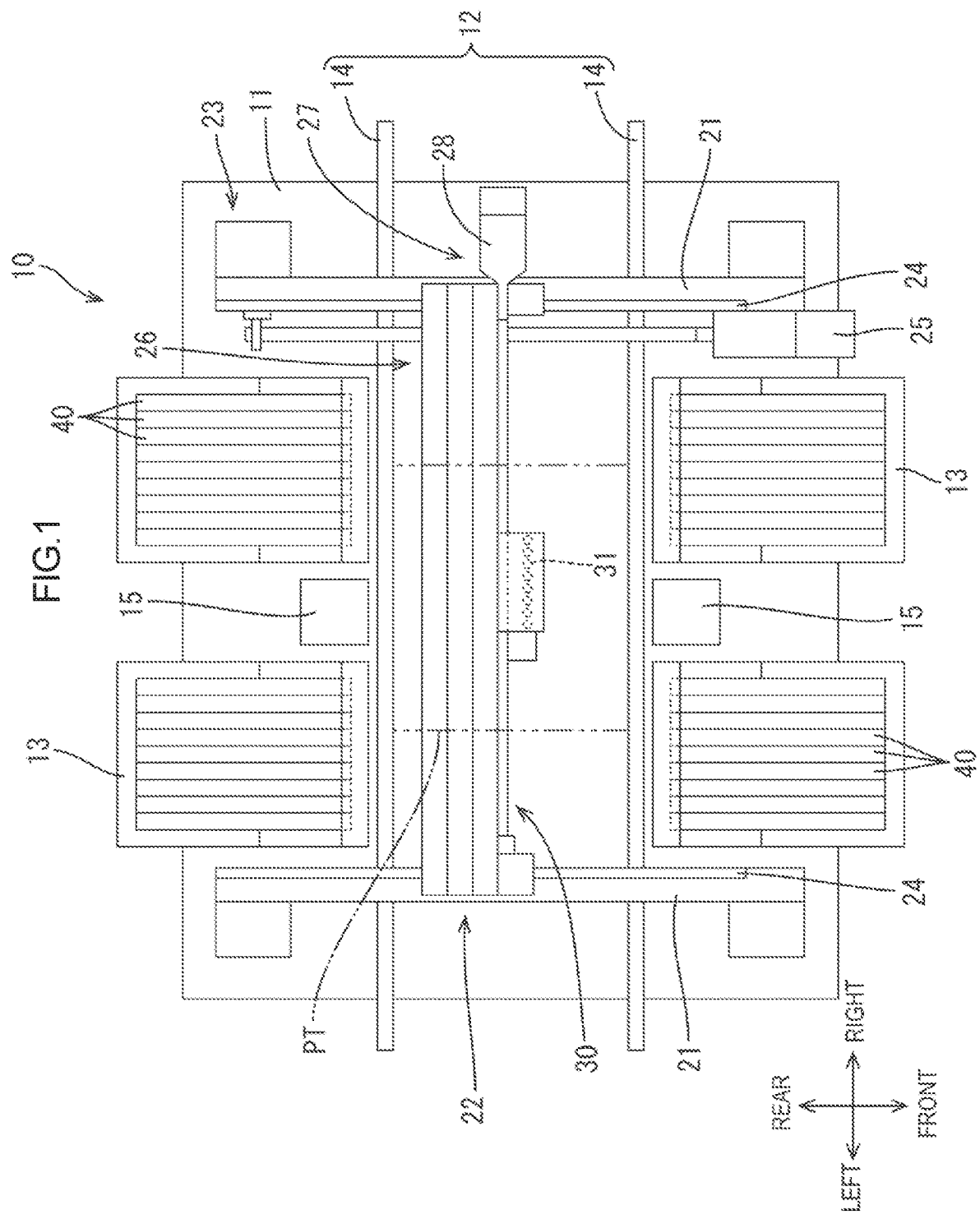
FIG. 1 is a plan view of a surface-mounting machine according to a first embodiment.

The base is a base where the carrier conveyer 12, the component mounting device 20, and so forth are arranged as depicted in FIG. 1. Below the carrier conveyer 12 on the base 11, a back-up plate not depicted for backing up that printed circuit board P and so forth when the electronic component E is mounted on the printed circuit board P are provided.

The carrier conveyer 12 is disposed at a substantially center portion of the base 11 in the front-and-back direction to carry the printed circuit board P to the lateral direction, as depicted in FIG. 1. The carrier conveyer 12 includes paired conveyer belts 14 driven in a circulated manner in the lateral direction. To the paired conveyer belts 14, the printed circuit board P is set in a form of bridging therebeween. The printed circuit board P is carried from the right side along the conveyer belts 14 into a component mounting position PT at a substantially center portion in the lateral direction on the base 11 and, after work of mounting the electronic component E is performed, is carried out to the left side along the conveyer belts 14.

The component mounting device 20 is configured to include, as depicted in FIG. 1, paired support frames 21 disposed on both sides of the base 11 in the lateral direction, a head unit 30, and a head driving device 22 which moves the head unit 30. The support frame 21 each have a long, narrow shape extending to the front-and-back direction, and are disposed on both sides of the base 11 in the lateral direction.

The head driving device 22 has a Y-axis servo mechanism 23 and an X-axis servo mechanism 27, and is provided so as to bridge between the paired support frames 21.

The Y-axis servo mechanism 23 has, as depicted in FIG. 1, paired Y-axis guide rails 24 provided along each support frame 21 in a form of extending to the lateral direction and a Y-axis servo motor 25 provided at an end of one Y-axis guide rail 24. To the paired Y-axis guide rails 24, a head support body 26 is attached in a form of bridging therebetween.

When the Y-axis servo motor 25 is controlled to be energized, the head support body 26 and the head unit 30 attached to the head support body 26 move along the Y-axis guide rails 24 to the front-and-back direction.

The X-axis servo mechanism 27 has, as depicted in FIG. 1, an X-axis guide rail 29 provided to the head support body 26 in a form of extending to the lateral direction and an X-axis servo motor 28 provided at an end of the X-axis guide rail 29. To the X-axis guide rail 29, the head unit 30 is movably attached along the lateral direction. When the X-axis servo motor 28 is controlled to be energized, the head unit 30 moves along the X-axis guide rail 29 to the lateral direction.

This allows the head unit 30 to move to a horizontal direction, which is a front-and-back and lateral direction, on the base 11.

Figure 2:
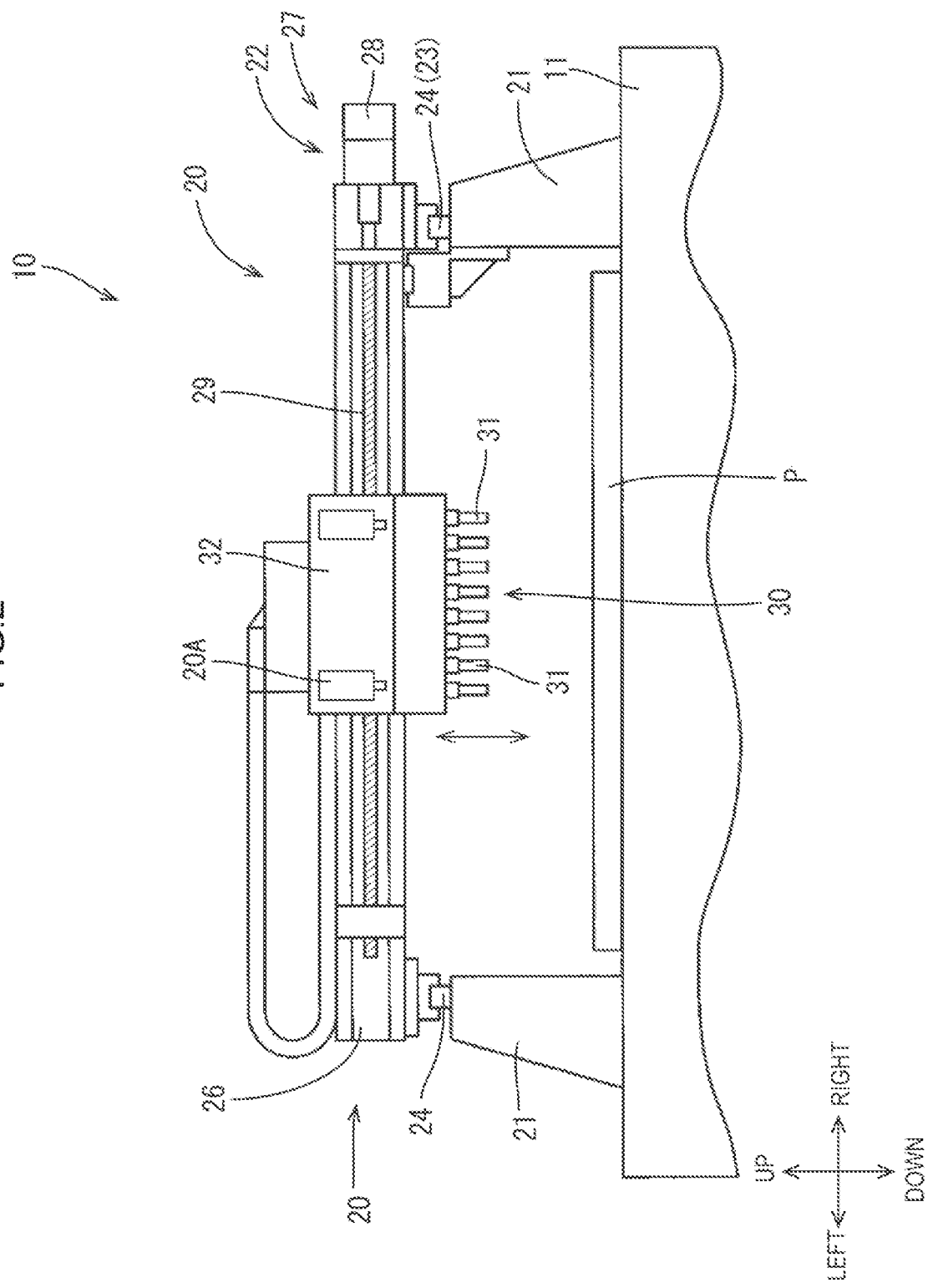
FIG. 2 is a front view of a head unit, depicting a state viewed from the front.

In the head unit 30, mounting heads 31 which mount the electronic component E are installed in a plurality of rows in the lateral direction, as depicted in FIG. 1 and FIG. 2. The mounting heads 31 are each configured to be able to ascend and descend to the vertical direction with respect to the head unit 30 by axial rotation by an R-axis motor and driving of a Z-axis motor 32. To each of the mounting heads 31, negative pressure is supplied from a negative-pressure supply source not depicted to cause a suction force at the tip of the mounting head 31.

With the X-axis servo mechanism 27, the Y-axis servo mechanism 23, and the Z-axis motor 32 activated at a predetermined timing, a process is performed in which the electronic component E is suctioned from any component supply unit 13, which will be described further below, by the mounting head 31 for implementation on the printed circuit board P.

The component mounting device 20 is provided with, as depicted in FIG. 2, a substrate recognition camera 20A which moves together with the head unit 30. The substrate recognition camera 20A takes an image of the printed circuit board P to perform image recognition of the printed circuit board P. Also, on both sides of the carrier conveyer 12 in the front-and-back direction on the base 11, paired component recognition cameras 15 are installed, as depicted in FIG. 1. The paired component recognition cameras 15 take images of the electronic component E suctioned and held at the tip of the mounting head 31 of the head unit 30.

The component supply units 13 are of a feeder type, as depicted in FIG. 1. With two aligned in the lateral direction on both sides in the vertical direction of the carrier conveyers 12, four in total are arranged. To these component supply units 13, a plurality of feeders (one example of a "component supply device") 40 are attached in a state of being aligned to the lateral direction.

Each feeder 40 draws a supply tape 80 having the plurality of electronic components E accommodated thereon from a reel R to supply, one by one, the electronic components E to each mounting head 31 in the head unit 30 of the component mounting device 20.

In the following description, when the feeder 40 is described in FIG. 3 to FIG. 12D, a lateral direction is with reference to a vertical direction in FIGS. 11A to 11D and a front-and-back direction is with reference to the lateral direction in FIG. 3, FIG. 10 and FIGS. 11A to 11D, and description is made with a left side in the drawings taken as a front side and a right side in the drawings taken as a rear side. Since a supply tape 80 is carried by being sent out from the rear to the front of the feeder 40, description may be made with a rear side of the feeder 40 taken as an upstream side of the carrying direction of the supply tape 80 and a front side of the feeder 40 taken as a downstream side of the carrying direction of the supply tape 80, for ease of description.

Figure 15:
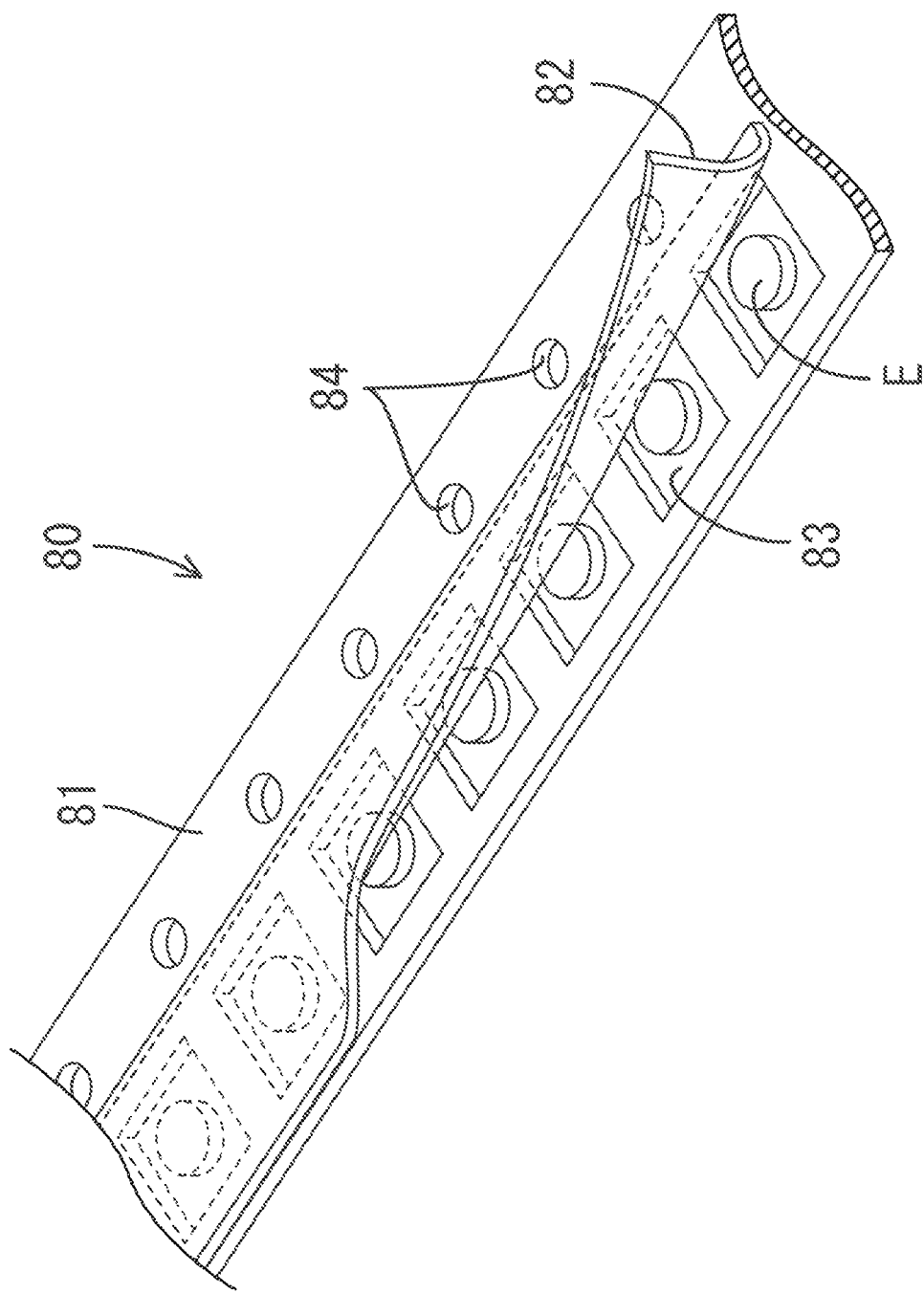
FIG. 15 is a perspective view of a supply tape, depicting a state in which one side edge of a cover tape is folded.
Figure 16:
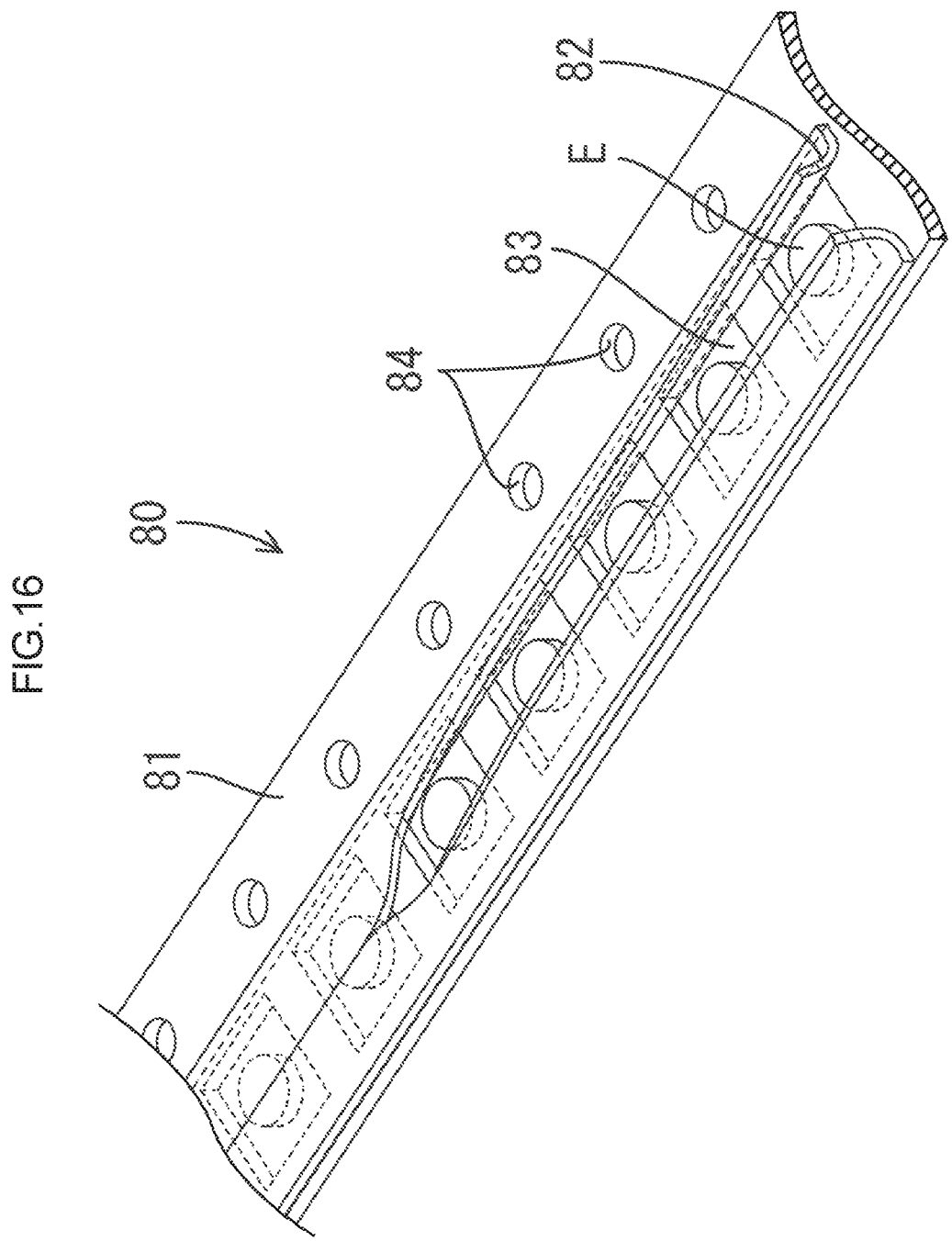
FIG. 16 is a perspective view of the supply tape, depicting a state in which the cover tape is cut by an insertion blade.

The supply tape 80 is formed in a tape shape elongated in the front-and-back direction as depicted in FIG. 3, and is supported as being wound around the reel R. The supply tape 80 is formed of a carrier tape 81 made of synthetic resin and a cover tape 82 to be affixed thereto and having a sheet shape made of synthetic resin, as depicted in FIG. 15 and FIG. 16. The carrier tape 81 has a plurality of recessed component accommodating units 83 opening upward at predetermined spacings, and the small electronic component E such as a chip resistance is accommodated in each component accommodating unit 83. The cover tape 82 is fixed to the carrier tape 81 by affixing both left and right side edge parts in a width direction of the cover tape 82 to an upper surface of both side edge parts in the lateral direction of the carrier tape 81, thereby preventing the electronic components E from being removed from the component accommodating units 83. ON one side edge of the carrier tape 81, a plurality of feed holes 84 are provided at certain spacings along an extending direction of the carrier tape 81.

The feeder 40 is configured to include, as depicted in FIG. 3 to FIG. 6, a feeder main body 41 elongated in the front-and-back direction, a front carrier unit (one example of a "first carrier means") 42 provided at the front of the feeder main body 41, and a rear carrier unit (one example of a "second carrier means") 44 provided at the rear of the feeder main body 41.

The feeder main body 41 is made of, for example, die-cast aluminum. The feeder main body 41 is provided with a tape carrier route 60 for carrying the supply tape 80 from the upstream side toward the downstream side.

The tape carrier route 60 is configured to include a main carrier route 61 extending backward from a front end part of the feeder main body 41, and a first carrier route 62 and a second carrier route 63 as branches into two backward from a rear end part of the main carrier route 61.

The main carrier route 61 is, as depicted in FIG. 3 to FIG. 6, in a form of extending linearly to the front-and-back direction from an upper-surface front end part 41A of the feeder main body 41 to a substantially center portion in the front-and-back direction of the rear carrier unit 44. A front end part of the main carrier route 61 is disposed in the front carrier unit 42.

The front carrier unit 42 is configured to include a first sprocket (one example of a "driving mechanism") 46 which carries the supply tape 80 toward a component suction position P1, which will be described further below, a second sprocket (one example of the "driving mechanism") 47 which carries the supply tape 80 toward an exposure unit 70, which will be described further below, a first tape detection sensor 75 which detects the presence or absence of the supply tape 80, and a front drive motor 48 and a plurality of gears not depicted in the drawings. The front drive motor 48 is controlled by a feeder control unit 40A, which will be described further below.

The first sprocket 46 and the second sprocket 47 are arranged so as to be aligned in the front-and-back direction at an upper end part of the feeder main body 41. With motive power of the front drive motor 48 transmitted by the plurality of gears, each of the sprockets 46 and 47 rotates to the same direction with the same pitch.

On the outer circumferential surfaces of the first sprocket 46 and the second sprocket 47, a plurality of teeth 46A and 47A, respectively, are equidistantly formed. These teeth 46A and 47A can fit in the feed holes 84 of the supply tape 80. The first sprocket 46 and the second sprocket 47 rotate in a state in which these teeth 46A and 47A fit in the feed holes 84 of the supply tape 80, and can thereby carry the supply tape 80 from the upstream toward the downstream on the main carrier route 61.

The first sprocket 46 is arranged substantially straight below the component suction position P1 where the component is suctioned at the front end of the main carrier route 61. That is, an upper end portion of the first sprocket 46 is at the component suction position P1 where the electronic component E is suctioned by the mounting head 31 as depicted in FIG. 3 to FIG. 6 and, with the first sprocket 46 carrying the supply tape 80, the component accommodating unit 83 can be correctly arranged at the component suction position P1.

Between the first sprocket 46 and the second sprocket 47 at the upper end part of the feeder main body 41, as depicted in FIG. 3 to FIG. 6, an exposure unit 70 is provided which expose the electronic components E accommodated on the supply tape 80.

The exposure unit 70 is formed in an insertion blade 71 with a tapered rear end part. With the insertion blade 71 inserted between one side edge part of the carrier tape 81 and the cover tape 82 of the supply tape 80 sent out by the second sprocket 47, as depicted in FIG. 15, the cover tape 82 is folded to one side of the carrier tape 81 to expose the electronic components E accommodated in the component accommodating units 83. That is, the second sprocket 47 is a sprocket for inserting the insertion blade 71 of the exposure unit 70 between the carrier tape 81 and the cover tape 82.

As a method of exposing the electronic components E in the component accommodating units 83 of the supply tape 80, the electronic components E accommodated in the component accommodating units 83 may be exposed by sharply configuring the insertion blade 71 of the exposure unit 70 and, as depicted in FIG. 16, cutting a substantially center portion of the cover tape 82 in the lateral direction along the carrying direction of the supply tape 80.

In the rear of the exposure unit 70 on the main carrier route 61, a first tape detection sensor (one example of a "detection unit") 75 is arranged which detects the presence or absence of the supply tape 80, as depicted in FIG. 3 to FIG. 6. The first tape detection sensor 75 outputs a detection signal to the feeder control unit 40A, which will be described further below.

The first tape detection sensor 75 is configured to include a lever 76 which is elastically displaced to the front and the back and a photosensor 78 having paired detection units 77 which detect a motion of the lever 76.

Figure 4:
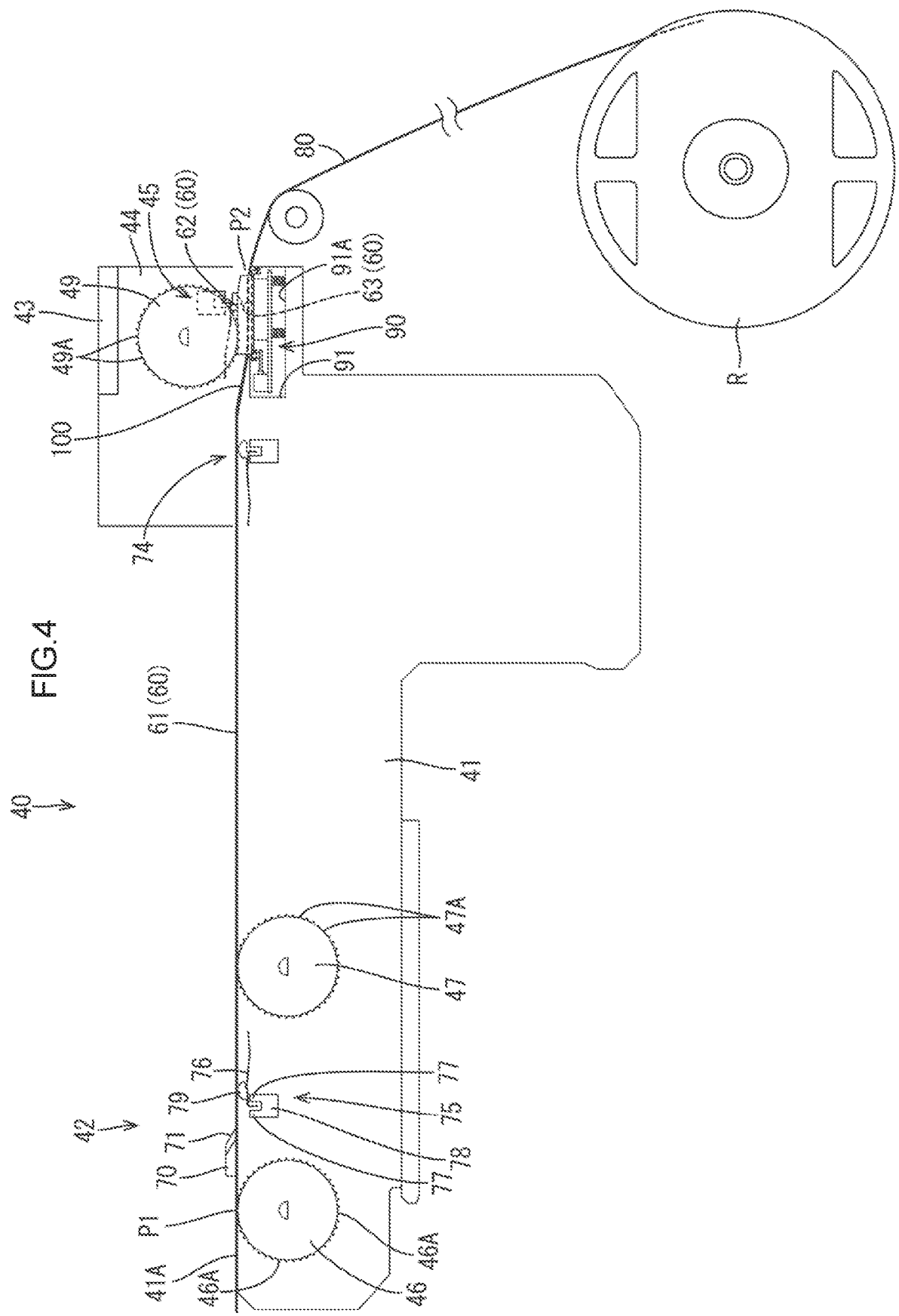
FIG. 4 is a side view of the feeder, depicting a state in which a supply route of the supply tape is changed from a first carrier route to a second carrier route.
Figure 5:
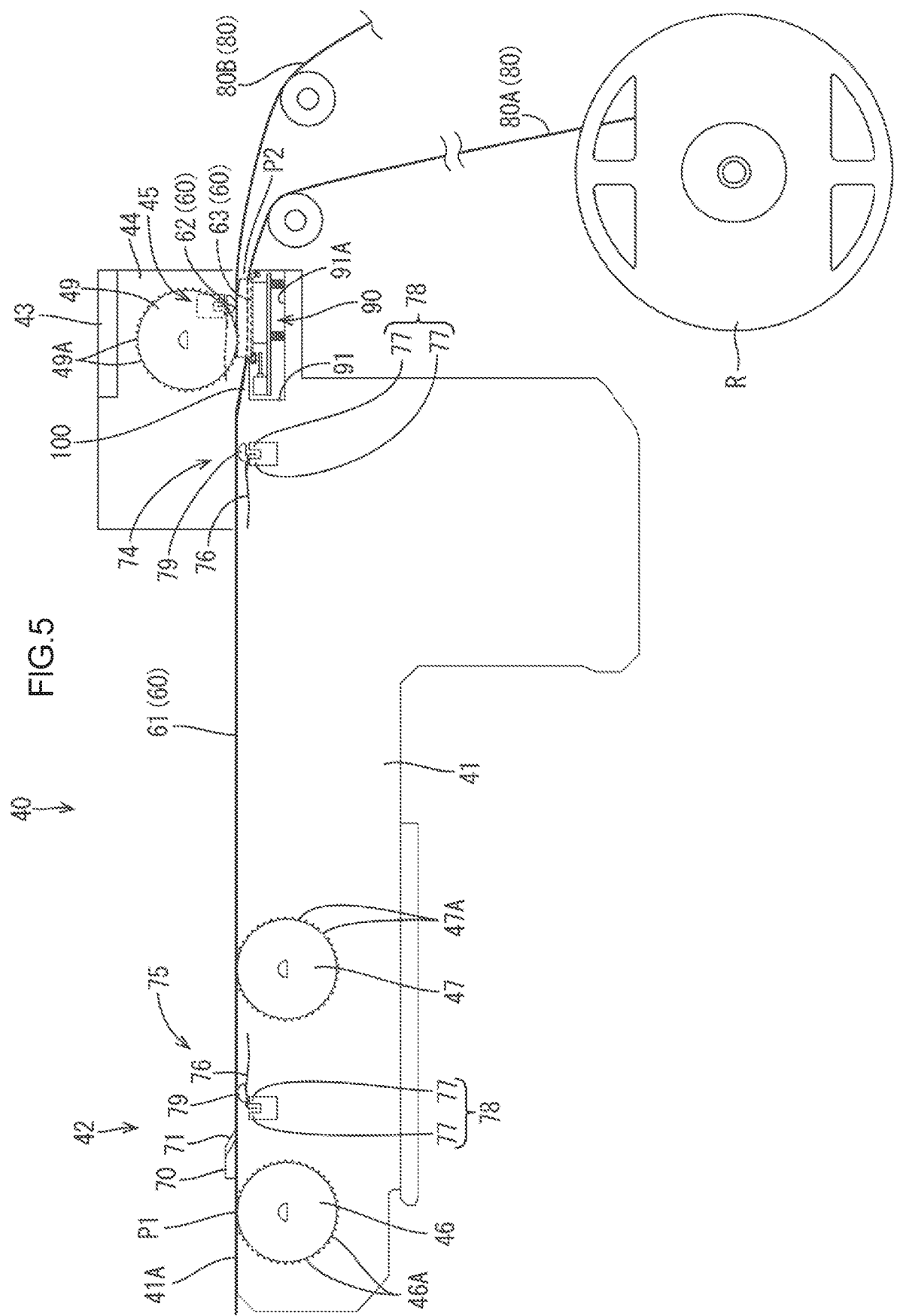
FIG. 5 is a side view of the feeder, depicting a state in which the preceding tape is disposed on the second carrier route and the subsequent tape is arranged on the first carrier route.

The lever 76 is in a form of extending to the front-and-back direction from a second sprocket 47 side toward a first sprocket 46 side. The tip of the lever 76 is bent downward. The lever 76 can be elastically displaced downward by taking a base end part as a fulcrum. On an upper part of the tip of the lever 76, a pressurized protrusion 79 is provided which protrudes above the main carrier route 61 when the lever 76 is in a natural state. When the supply tape 80 is disposed on the main carrier route 61, as depicted in FIG. 3 to FIG. 5, with the pressurized protrusion 79 pressurized downward by the supply tape 80, the lever 76 is elastically displaced downward. The tip of the lever 76 then enters between the paired detection units 77 to cut off light between the paired detection units 77, and it is thereby detected that the supply tape 80 is disposed on the main carrier route 61.

Figure 6:
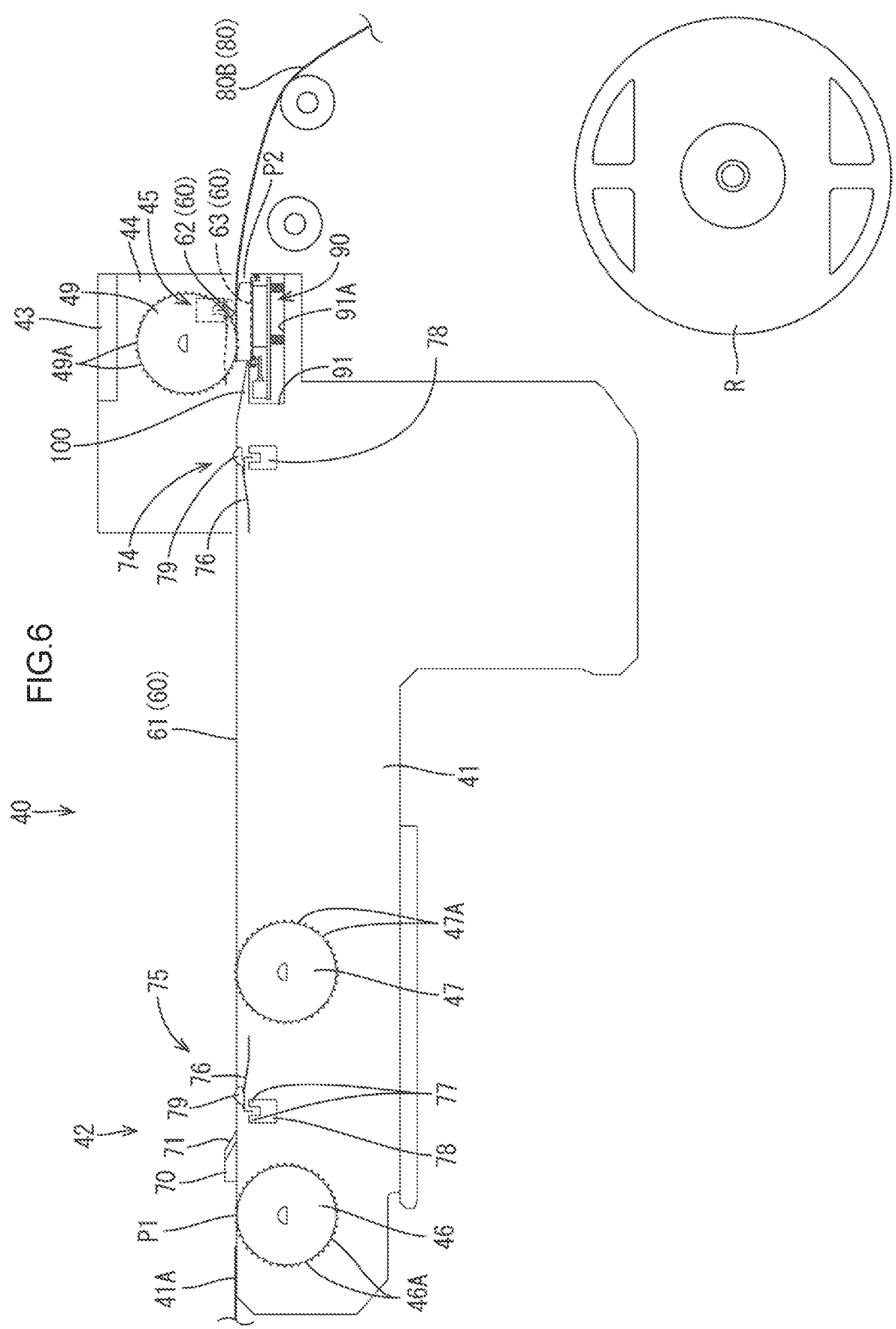
FIG. 6 is a side view of the feeder, depicting a state immediately before the preceding tape runs out of components and carrying of the subsequent tape on the first carrier route starts.

When the trailing edge of the supply tape 80 reaches the position of the pressurized protrusion 79 of the lever 76, as depicted in FIG. 6, the pressurized state of the pressurized protrusion 79 by the supply tape 80 is released, and the lever 76 is elastically returned. This allows detection of the presence or absence of the supply tape 80 (the trailing edge or leading edge of the supply tape 80) at the position of the first tape detection sensor 75.

Figure 7:
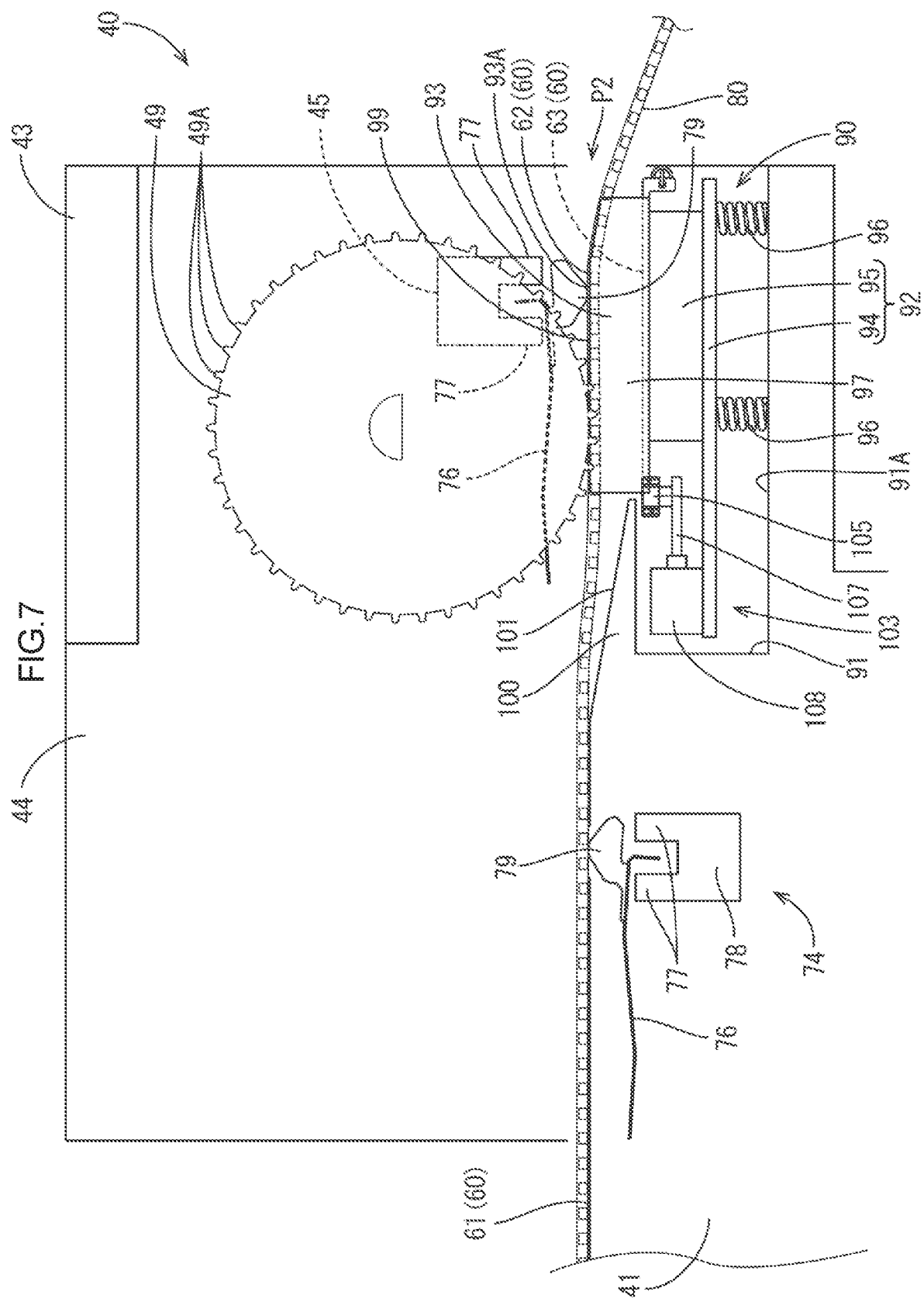
FIG. 7 is an enlarged side view of a rear carrier unit in FIG. 3.
Figure 8:
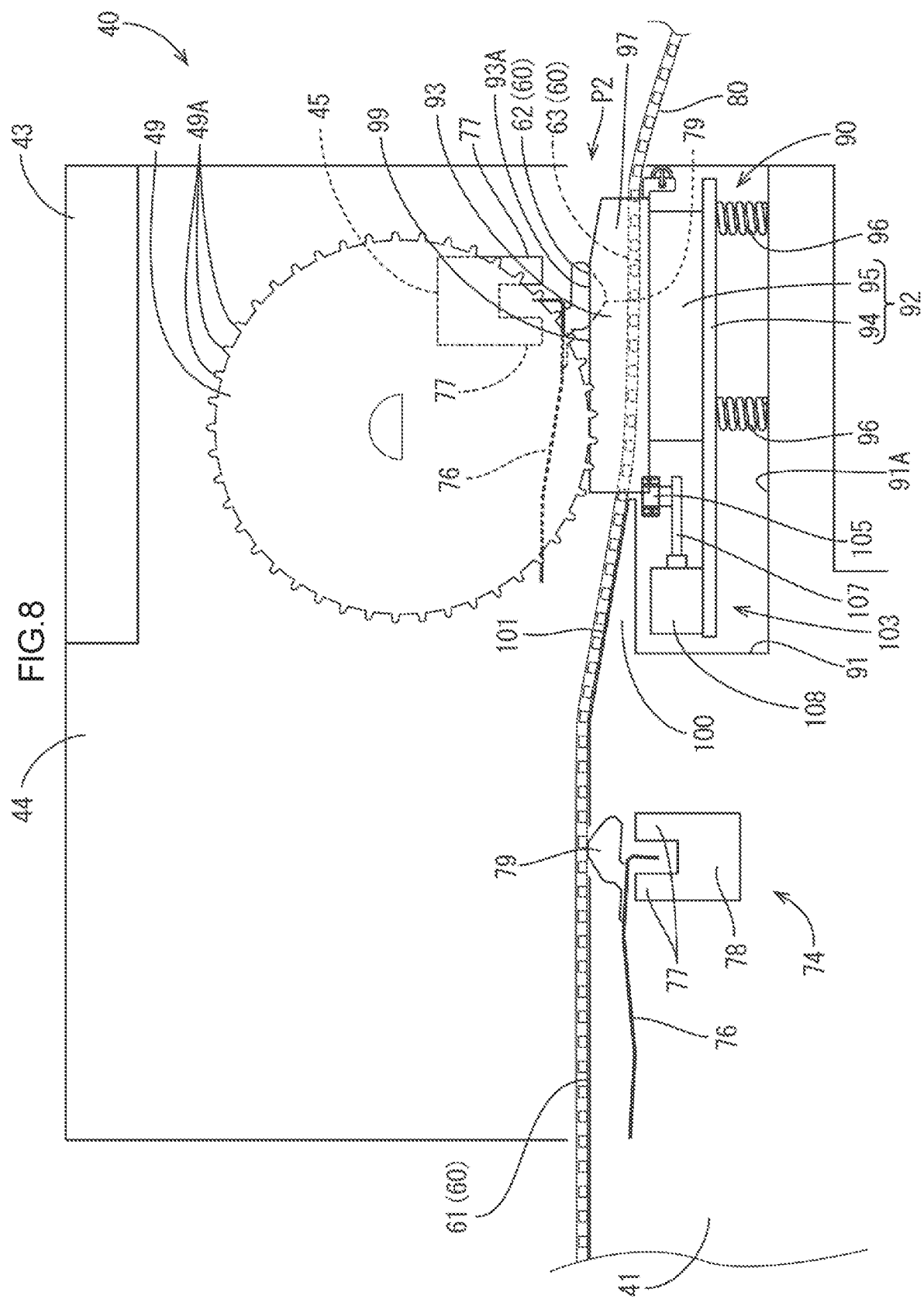
FIG. 8 is an enlarged side view of the rear carrier unit in FIG. 4.
Figure 9:
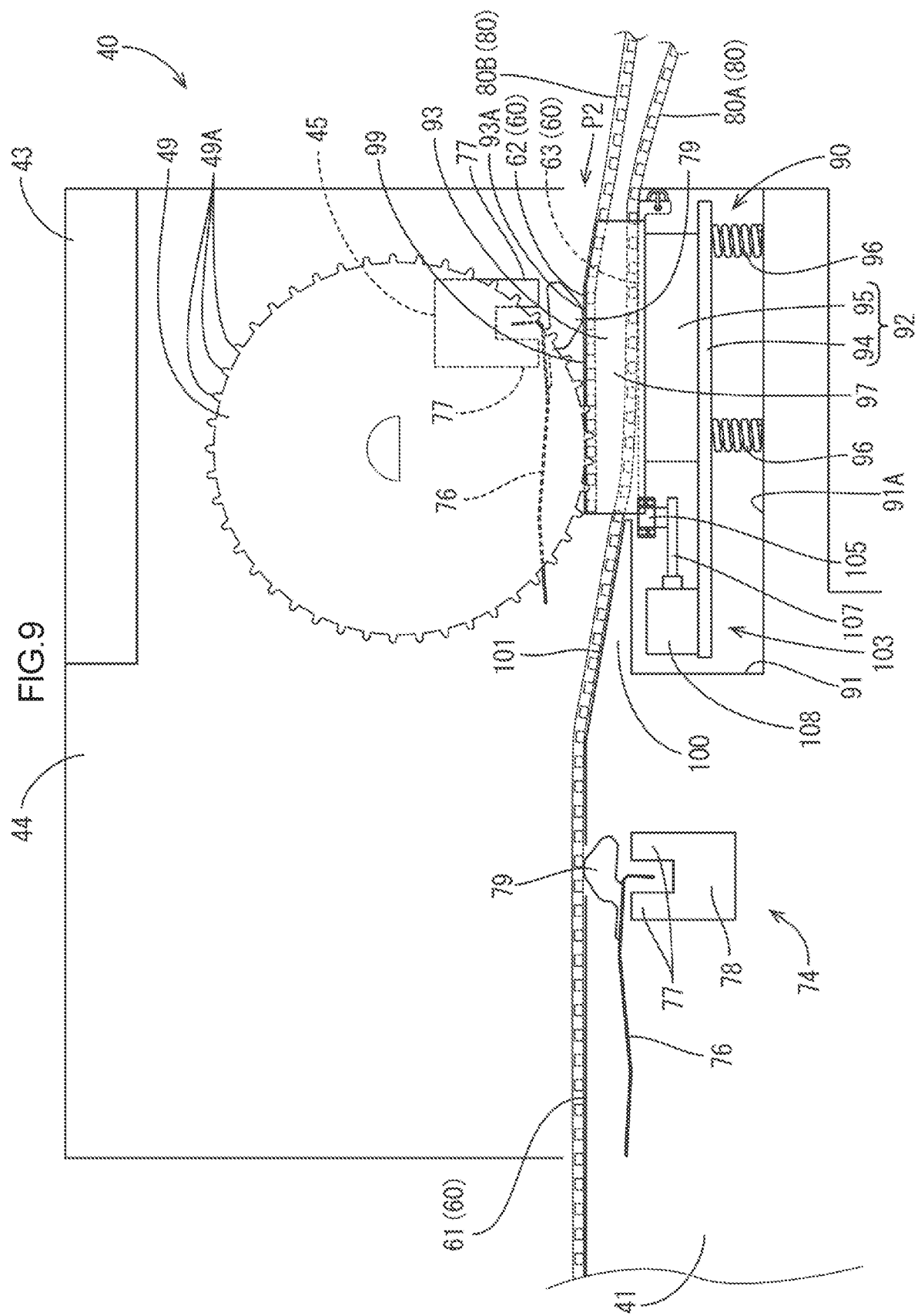
FIG. 9 is an enlarged side view of the rear carrier unit in FIG. 5.
Figure 10:
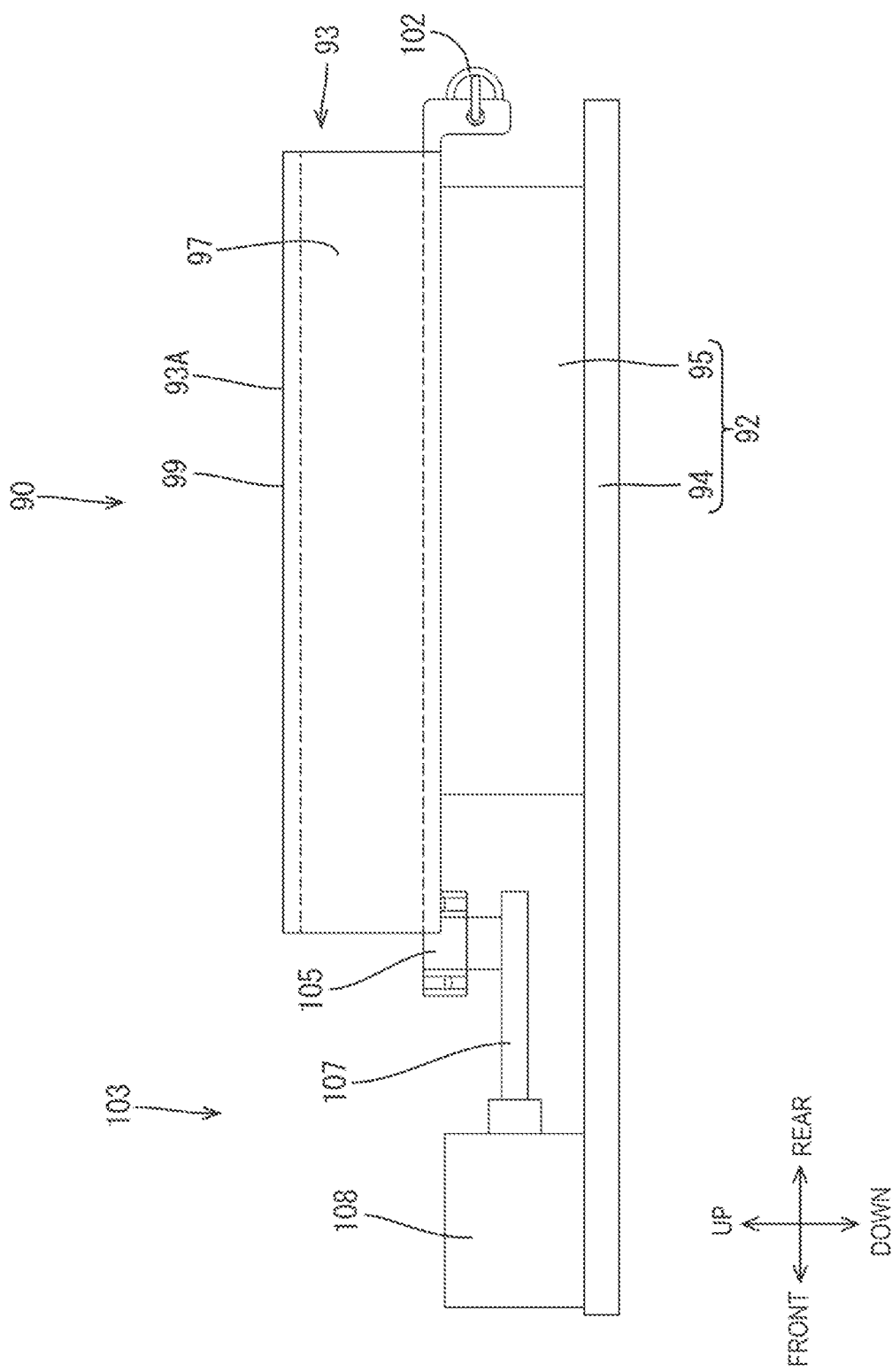
FIG. 10 is a side view of a loading unit.
Figure 11:
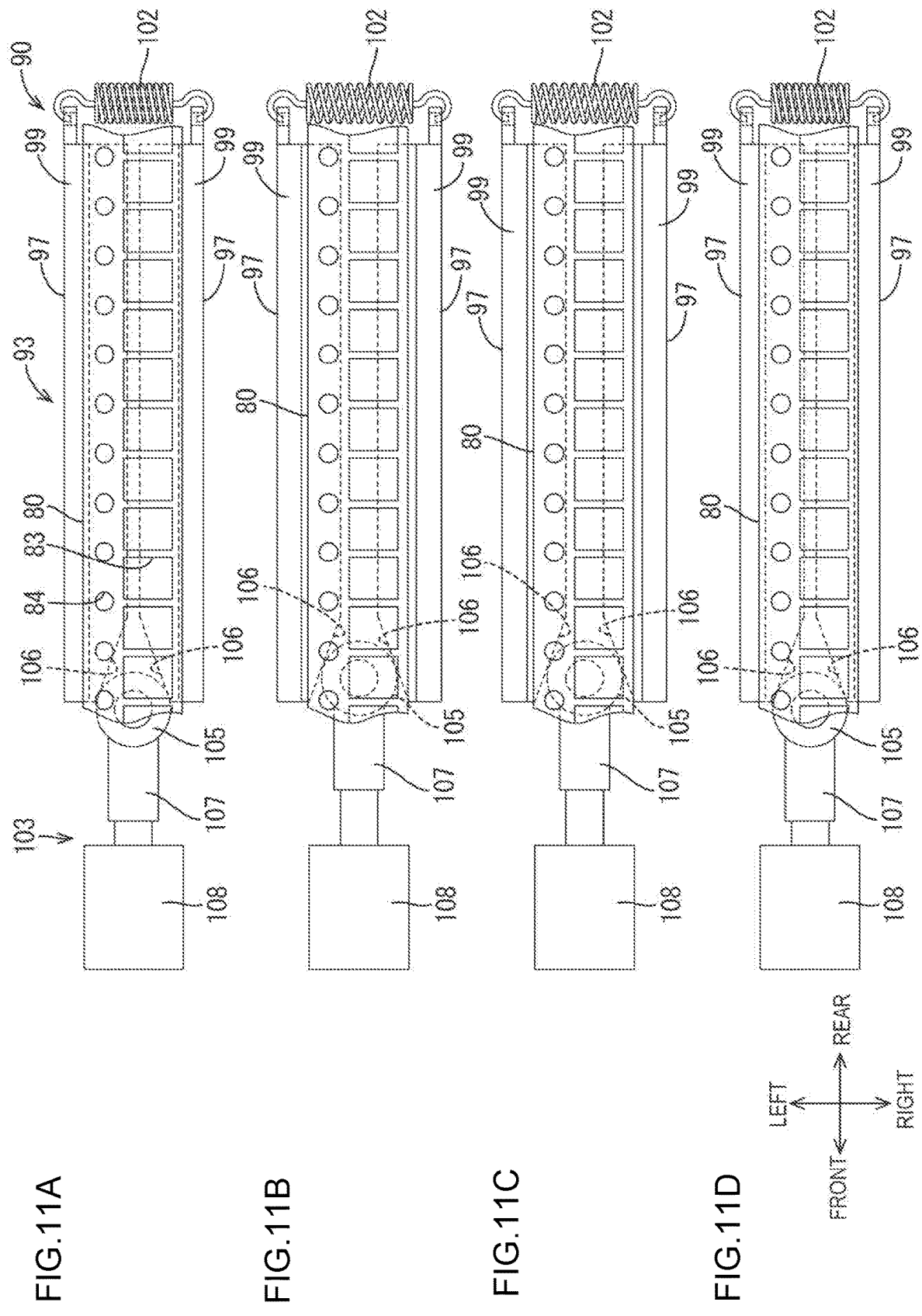
FIGS. 11A to 11D are plan views of the loading unit, depicting a process in which paired frame bodies are displaced between a support position and a retreat position.
Figure 12:
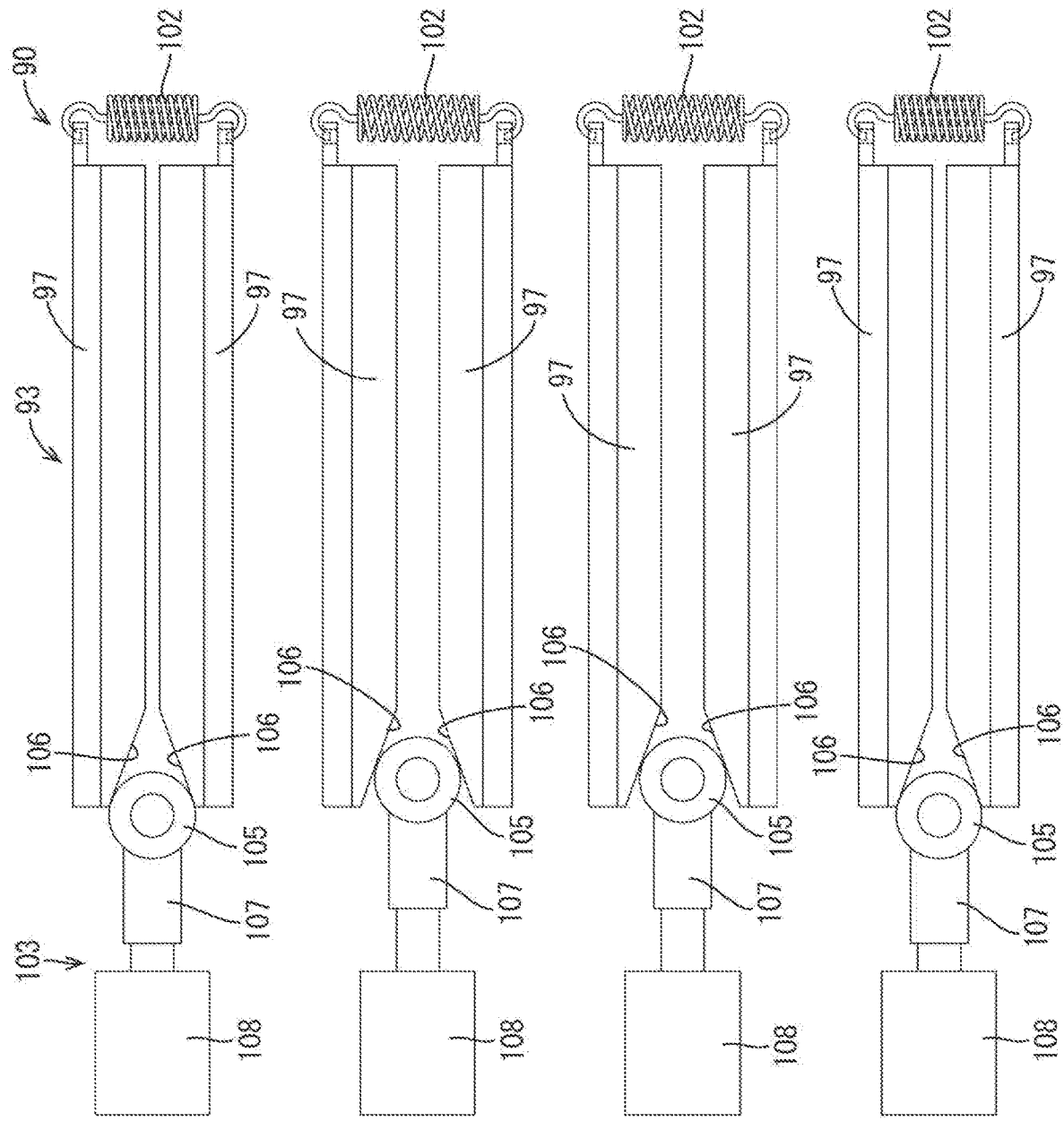
FIGS. 12A to 12D are bottom views of the loading unit, depicting the process in which the paired frame bodies are displaced between the support position and the retreat position.
Figure 13:
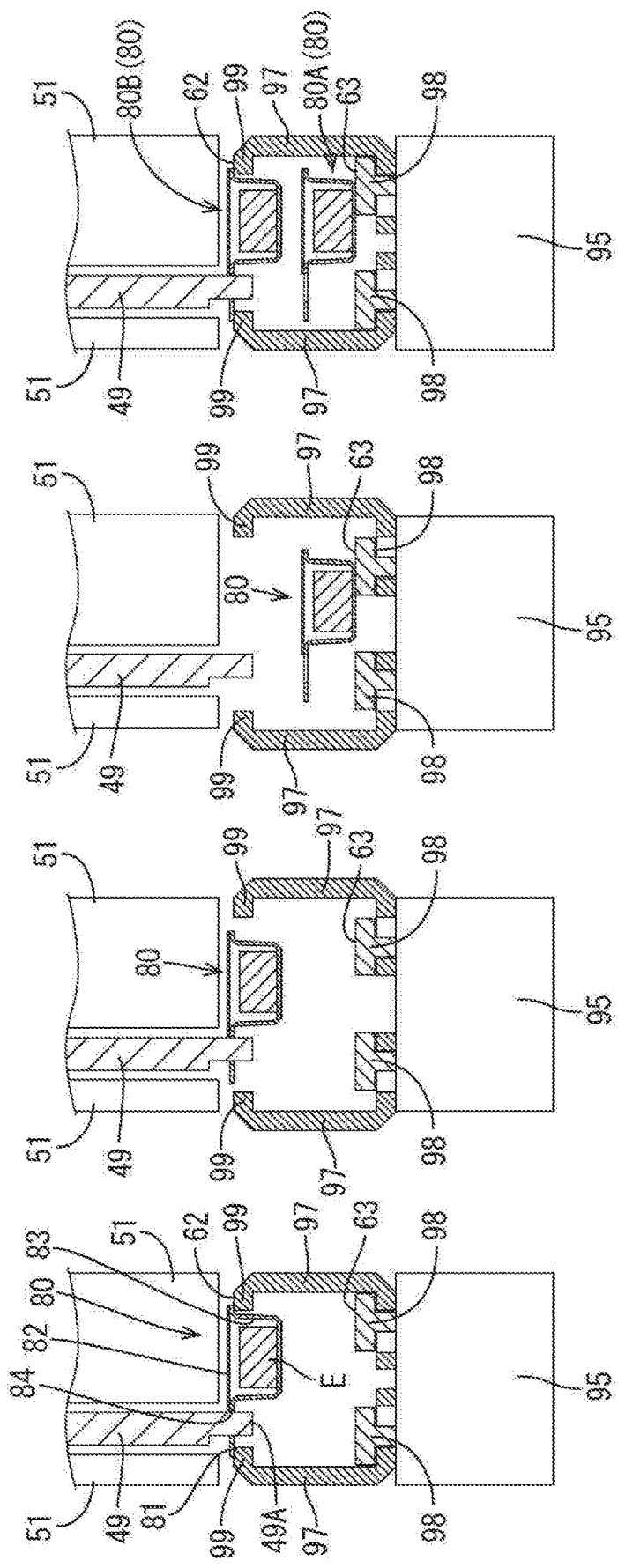
FIGS. 13A to 13D are sectional views of the loading unit, depicting the process in which the paired frame bodies are displaced between the support position and the retreat position.

The first carrier route 62 and the second carrier route 63 in the tape carrier route 60 are provided, as depicted in FIG. 7 to FIG. 9, in the rear carrier unit 44 as branches from a rear end part, which is an upstream end part of the main carrier route 61 of the carrying direction, to the vertical direction, which is a thickness direction of the supply tape 80.

The rear carrier unit 44 is configured to include, as depicted in FIG. 7 to FIG. 9, a third sprocket 49 which carries the supply tape 80 inserted from a tape insertion position P2 provided at a rear end of the rear carrier unit 44 to the main carrier route 61, a rear drive motor 50 which drives the third sprocket 49, a loading unit 90 which supports the supply tape 80, and a tape insertion sensor 45 which detects that the tape has been inserted at the tape insertion position P2. The rear drive motor 50 is controlled by the feeder control unit 40A.

The third sprocket 49 is rotatably provided in the rear of the rear carrier unit 44, and rotates by motive power of the rear drive motor 50. On the outer circumferential surface of the third sprocket 49, a plurality of teeth 49A are equidistantly formed. These teeth 49A can fit in the feed holes 84 of the supply tape 80.

The third sprocket 49 rotates in a state in which these teeth 49A fit in the feed holes 84 of the supply tape 80, and can thereby carry the supply tape 80 from the upstream toward the downstream.

The tape insertion sensor 45 has a structure similar to that of the first tape detection sensor 75. When the supply tape 80 is inserted from the tape insertion position P2 into the rear carrier unit 44, as depicted in FIG. 7, the pressurized protrusion 79 is pressurized by the supply tape 80 upward, and the tip of the lever 76 cuts off light between the paired detection units 77, thereby detecting that the supply tape 80 has been inserted into the rear carrier unit 44.

At an upper end part of the rear carrier unit 44, an operation panel 43 is provided which displays various information about the feeders 40 and operates the feeders 40.

Figure 17:
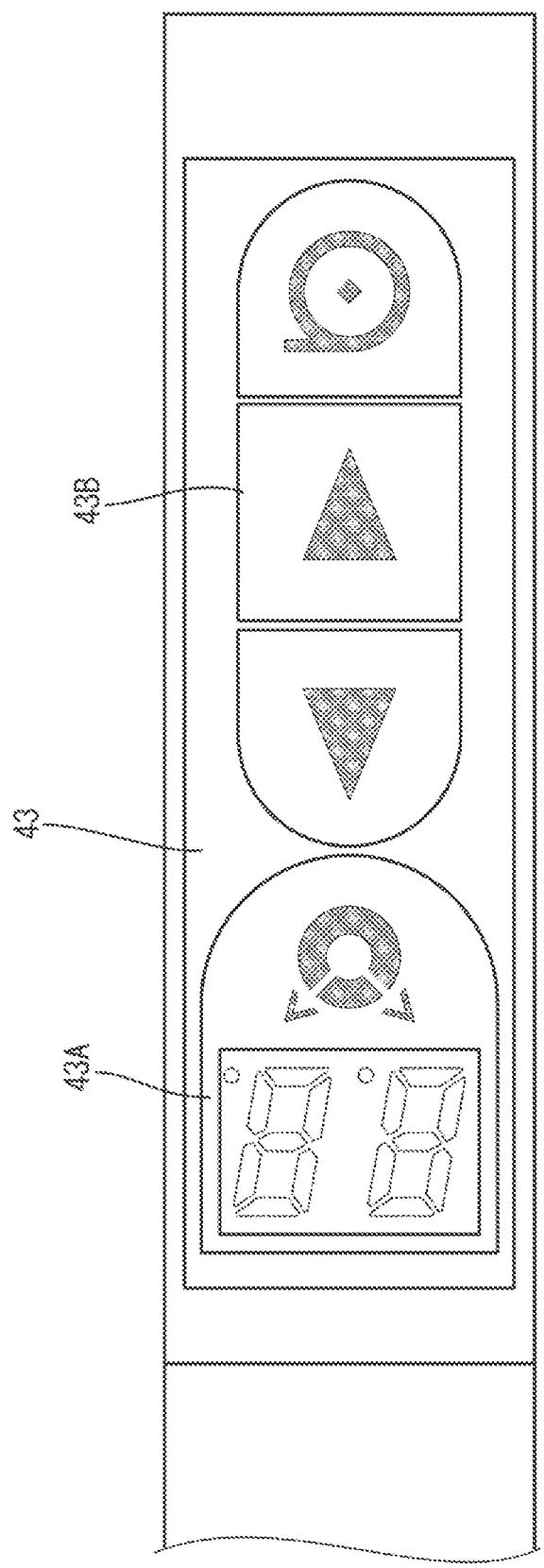
FIG. 17 is a plan view of an operation panel depicting a state viewed from above.

A front end of the operation panel 43 is a display unit 43A which displays a number or character by segments such as LEDs as depicted in FIG. 17. In the rear of the display unit 43A, operation buttons 43B are arranged.

The loading unit 90 is fixed to a bottom wall 91A of the unit accommodating unit 91 opening backward below the third sprocket 49, as depicted in FIG. 7 to FIG. 10, and is configured to include a base 92 and a carrier route structure 93 provided on the base 92.

The base 92 is in a form of in which a block-shaped base main body 95 is fixed onto a base plate 94 in a plate shape elongated to the front and the back, the base main body 95 being shorter than the base plate 94. The carrier route structure 93 long in the front-and-back direction is fixed onto the base main body 95 along the base main body 95. At a lower end part of the base plate 94, a pressurizing member 96 formed of a coil spring which pressurizes the base 92 upward is fixed. The base 92 is fixed to the bottom wall 91A of the unit accommodating unit 91 via the pressurizing member 96.

The pressurizing member 96 pressurizes the carrier route structure 93 upward via the base 92. With the carrier route structure 93 pressurized by the pressurizing member 96, as depicted in FIG. 7 to FIG. 9, an upper surface 93A of the carrier route structure 93 is arranged slightly above a lower end part of the third sprocket 49.

The carrier route structure 93 configures the first carrier route 62 and the second carrier route 63 as depicted in FIG. 7 to FIG. 9, and is configured to include, as depicted in FIG. 10 to FIG. 13D, paired frame bodies 97 elongated to the front-and-back direction and configuring the first carrier route 62 in a state of facing each other in the lateral direction and paired support bodies 98 elongated to the front-and-back direction and configuring the second carrier route 63 at lower end parts of the paired frame bodies 97.

The paired frame bodies 97 each form a substantially U-shape as depicted in FIGS. 13A to 13D, and are arranged with their openings facing each other. The paired frame bodies 97 can be slidably displaced to the lateral direction between a support position where they are arranged so as to be most closed to each other as depicted in FIGS. 13A and 13D and a retreat position where they are displaced outward in a direction in which they are away from each other, as depicted in FIGS. 13B and 13C.

The lower end parts of the paired frame bodies 97 protrude inside mutually as a counterpart side more than their upper end parts. Upper protrusion end parts of the paired frame bodies 97 are paired tape support units 99 which support the supply tape 80 from below.

The paired tape support units 99 are each provided over the entire length of the frame body 97 so as to have an upper surface arranged approximately at the straight back of the main carrier route 61. A space between the paired tape support units 99 at the support position is set so as to be narrower than the width dimension of the supply tape 80 in the lateral direction as depicted in FIGS. 13A and 13D, and one at the retreat position is set so as to be wider than the width dimension of the supply tape 80 as depicted in FIGS. 13B and 13C.

That is, while the supply tape 80 can be arranged on the paired tape support units 99 disposed at the support position as depicted in FIGS. 13A to 13D, when the paired tape support units 99 are disposed at the retreat position, the space between the paired tape support units 99 becomes larger than the width dimension of the supply tape 80, thereby causing the supply tape 80 to drop from the paired tape support units 99.

That is, the upper surface of the paired tape support units 99 in the state in which the paired frame bodies 97 are disposed at the support position is the first carrier route 62 linearly extending to the front-and-back direction approximately at the straight back of the main carrier route 61. A rear end part of the paired frame bodies 97 is the tape insertion position P2 where the supply tape 80 is inserted into the rear carrier unit 44.

Between the paired tape support units 99, as depicted in FIGS. 13A to 13D, the carrier route structure 93 is pressurized upward by the pressurizing member 96 via the base 92, and the teeth 49A of the third sprocket 49 thereby enter from above even if the paired frame bodies 97 are arranged at either of the support position and the retreat position.

Therefore, when the supply tape 80 is inserted from the tape insertion position P2 onto the paired tape support units 99, the supply tape 80 is pressed from below to the third sprocket 49 by the paired tape support units 99 pressurized upward by the pressurizing member 96, and the feed holes 84 of the supply tape 80 fit to the teeth 49A of the third sprocket 49. In this state, the third sprocket 49 is rotated by the rear drive motor 50, and thereby carrying the supply tape 80 from the first carrier route 62 to the main carrier route 61 as depicted in FIG. 3 and FIG. 7 and allowing the supply tape 80 to reach the position of the second sprocket 47.

With the supply tape 80 detected by the first tape detection sensor 75 on the main carrier route 61, it is regarded that the supply tape 80 has reached the second sprocket 47 of the front carrier unit 42 to start carrying, and the rear drive motor 50 stops. A rotation shaft of the third sprocket is provided with a one-way clutch not depicted, which rotates to the carrying direction of the supply tape 80 but is not rotated to a direction reverse to the carrying direction. When the rear drive motor 50 stops, the first sprocket rotates with the carrying of the tape by the rotation of the second sprocket 47.

On both sides of the third sprocket 49, as depicted in FIGS. 13A to 13D, paired restricting members 51 are provided which restrict excessive entry of the third sprocket 49 between the paired tape support units 99. With the paired restricting members 51 making contact with the carrier route structure 93, excessive entry of the third sprocket 49 between the paired tape support units 99 is restricted.

On the other hand, the paired support bodies 98 are each in a form elongated to the front-and-back direction and having a T-shaped cross section, as depicted in FIGS. 13A to 13D. Lower end parts of the paired support bodies 98 are fixed onto the base main body 95 of the base 92 in a state of penetrating to the vertical direction through lower protrusion end parts of the paired frame bodies 97 protruding inward. With this, the lower protrusion end parts of the frame bodies 97 respectively make contact with the lower end parts of the support bodies 98 from outside in the lateral direction, thereby causing each frame body 97 to be positioned so as not to be displaced inward than the support position. The lower protrusion end parts of the frame bodies 97 respectively make contact with the lower end parts of the support bodies 98 from inside in the lateral direction, thereby causing each frame body 97 to be positioned so as not to be displaced outward than the retreat position.

The paired support bodies 98 are provided in the paired frame bodies 97 from front end parts over rear end parts of the frame bodies 97. A space between the paired support bodies 98 is set so as to be narrower than the width dimension of the supply tape 80 in the lateral direction.

An upper surface of the paired support bodies 98 is arranged at the rear of an eaves part 100 protruding backward from an upper end of a front wall of the unit accommodating unit 91, as depicted in FIG. 7 to FIG. 9, and forms the second carrier route 63 together with a tilted surface 101 provided on an upper surface of the eaves part 100 as being tilted diagonally downward from the rear end part of the main carrier route 61.

That is, the second carrier route 63 connects to the rear end part of the main carrier route 61 so as to extend from the rear end part of the main carrier route 61 slightly diagonally downward and backward and then be substantially parallel to the first carrier route 62 at a position slightly lower than the first carrier route 62.

That is, as depicted in FIG. 13C, with the paired frame bodies 97 being displaced from the support position to the retreat position to eliminate support by the paired tape support units 99 from below, the supply tape 80 carried via the first carrier route 62 to the second sprocket 47 of the main carrier route 61 drops downward by the self-weight of the supply tape 80, and is arranged on the second carrier route 63.

In this state, when carrying of the supply tape 80 is performed by the second sprocket 47, the supply tape 80 is carried from the reel R via the second carrier route 63 to the main carrier route 61.

The supply tape 80 is provided with slight tension between the reel R and the second sprocket 47. With the paired frame bodies 97 being displaced from the support position to the retreat position, the supply tape 80 may move quickly from the first carrier route 62 to the second carrier route 63.

While a second tape detection sensor 74 which detects the presence or absence of the supply tape 80 is arranged on the main carrier route 61 in the rear carrier unit 44, the structure of the second tape detection sensor 74 is similar to that of the first tape detection sensor 75, and therefore description thereof is omitted.

In the present embodiment, for example, when the trailing edge of the supply tape 80 is detected by the second tape detection sensor 74 and suction mistakes (detections of no component) a predetermined number of times by the mounting head 31 have occurred at the component suction position P1, depletion of components on the supply tape 80 is determined. The present embodiment is not limited to this. Depletion of components on the supply tape 80 may be determined when the trailing edge of the supply tape 80 is detected by the first tape detection sensor 75 in place of the second tape detection sensor 74 and suction mistakes a predetermined number of times by the mounting head 31 have occurred.

The loading unit 90 has a pressing member 102 which pulls the paired frame bodies 97 to each other and presses them toward the support position and a route switching device (one example of "tape route automatic change means") 103 which displaces the paired frame bodies 97 against the pressing member 102 from the support position to the retreat position.

The pressing member 102 is a tension coil spring which causes the paired frame bodies 97 to be attracted to each other and presses them toward the support position at the rear end part of the paired frame bodies 97 as depicted in FIGS. 12A to 12D. When the pressing member 102 is in a natural state, the paired frame bodies 97 are pressed to the support position with the paired frame bodies 97 attracted to each other. By displacing the paired frame bodies 97 outward against the pressing member 102, the paired frame bodies 97 are arranged at the retreat position.

On the other hand, the route switching device 103 is configured to include, as depicted in FIG. 10 to FIG. 12D, a pressurizing unit 105 in a substantially columnar shape and entering from above between the paired frame bodies 97, a cylinder unit 107 in a plate shape elongated from the front and the rear and supporting the pressurizing unit 105 from below, and a pressure driving unit 108 which displaces the cylinder unit 107 to the front-and-back direction.

The pressure driving unit 108 is formed of, for example, a solenoid motor for driving by switching between energization and non-energization, and displaces the pressurizing unit 105 via the cylinder unit 107 to the front-and-back direction.

On the other hand, at lower end parts of the front ends of the paired frame bodies 97, paired pressurized parts 106 are provided which slide in the front-and-back direction together with the pressurizing unit 105, with the pressurizing unit 105 of the route switching device 103 entering from the front.

The paired pressurized units 106 are each in a form of, as depicted in FIGS. 11A to 11D and FIGS. 12A to 12D, being linearly tilted to swell inward so as to be closer to each other from the front to the back, and the pressurizing unit 105 can enter a final position at a substantially center portion of the paired pressurized units 106 in the front-and-back direction.

In the paired pressurized units 106, as depicted in FIGS. 11A and FIG. 12A, in a state in which the paired frame bodies 97 are disposed at the support position, a space in the lateral direction at their front ends is set to have a dimension slightly smaller than the outer diameter of the pressurizing unit 105. When the pressurizing unit 105 is pushed forward by the pressure driving unit 108, the pressurizing unit 105 enters between the paired pressurized units 106 while sliding with the paired pressurized units 106, thereby causing, as depicted in FIGS. 11B and 11C, and FIGS. 12B and 12C, the paired frame bodies 97 to be displaced outward each other and the pressurizing unit 105 to reach the final position, which causes the paired frame bodies 97 to be disposed at the retreat position.

Conversely, when the cylinder unit 107 is moved forward to return the pressurizing unit 105 to an initial position, the paired frame bodies 97 are attracted to each other by the pressing member 102 to be displaced inward and arranged at the support position, as depicted in FIG. 11D.

That is, according to the present embodiment, by moving the pressurizing unit 105 to the front and the back between the initial position and the final position by the pressure driving unit 108 in the route switching device 103, the paired frame bodies 97 are displaced between the support position and the retreat position, and the carrier route of the supply tape 80 can be switched from the first carrier route 62 to the second carrier route 63.

Figure 14:
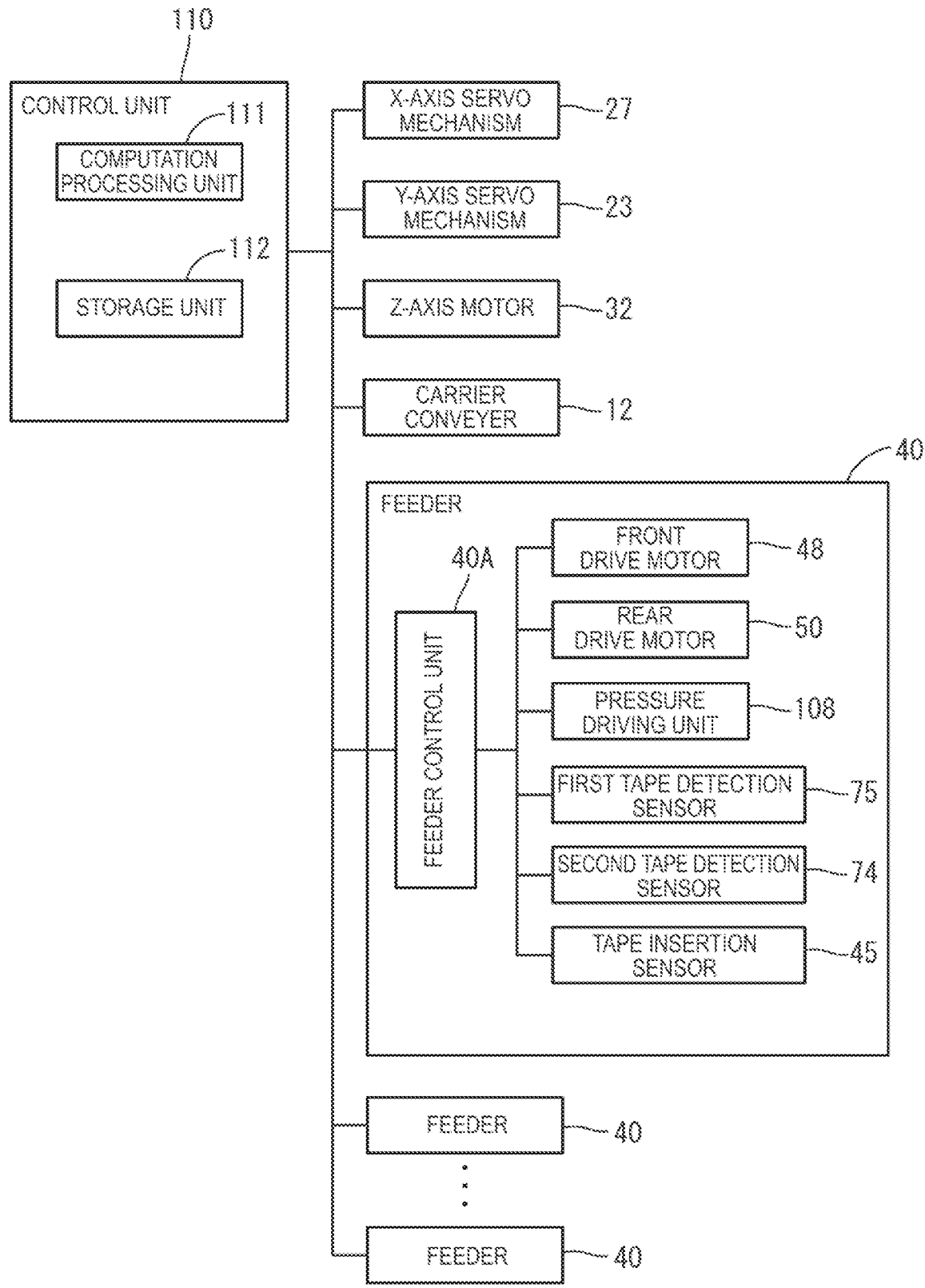
FIG. 14 is a block view depicting an electrical structure of a surface-mounting machine.

Next, an electrical structure of the surface-mounting machine 10 is described with reference to FIG. 14.

The surface-mounting machine 10 is controlled by a control unit 110 in a centralized manner in its entirety. The control unit 110 is configured of a computation processing unit 111 configured of a CPU and so forth, a storage unit 112, and so forth.

The storage unit 112 is configured of a ROM (Read Only Memory), RAM (Random Access Memory), or the like. In the storage unit 112, various programs to be executed by the computation processing unit 111 and various data are stored. Specifically, stored as mounting programs are a mounting program for mounting the electronic component E by controlling the component mounting device 20, the carrier conveyers 12, and the component supply units 13, control programs for controlling the respective drive motors in the feeders 40, and so forth.

The computation processing unit 111 controls the surface-mounting machine 10 by following various programs stored in the storage unit 112, for example, driving the carrier conveyer 12 and the component mounting device 20 by following the mounting programs and controlling each feeder 40 attached to the component supply unit 13 to mount the electronic components E on the printed circuit board P.

Also into the computation processing unit 111, imaging signals outputted from the substrate recognition camera 20A and the component recognition cameras 15 are each captured. Based on the imaging signals, analysis on an component image and analysis on a substrate image are performed.

Furthermore, the computation processing unit 111 outputs an instruction to the feeder control unit 40A provided to each feeder 40 based on the control programs for various drive motors stored in the storage unit 112. With the feeder control unit 40A controlling the front drive motor 48 of the front carrier unit 42 and the rear drive motor 50 of the rear carrier unit 44, a loading process of setting the supply tape 80 to the feeders 40 is performed.

In the following, the loading process in the feeder 40 is described.

First, the loading process when the supply tape 80 is newly set to the feeder 40 is described.

In the loading process when the supply tape 80 is newly set, first, a worker inserts the supply tape 80 from the tape insertion position P2 in the rear carrier unit 44 onto the paired tape support units 99 in the loading unit 90.

Then, the supply tape 80 pressurizes the pressurized protrusion 79 of the tape insertion sensor 45 upward to cause light between the paired detection units 77 to be cut off by the tip of the lever 76, thereby causing the tape insertion sensor 45 to become in an ON state and detecting that the supply tape 80 has been inserted into the rear carrier unit 44. Here, the supply tape 80 is not disposed on the main carrier route 61, and the second tape detection sensor 74 and the first tape insertion sensor 75 are in an OFF state. The supply tape 80 enters between the third sprocket 49 and the paired tape support units 99 while being pressed to the third sprocket 49 by the paired tape support units 99 pressurized by the pressurizing member 96 upward, and the feed holes 84 of the supply tape 80 fit to the teeth 49A of the third sprocket 49.

Therefore, in an initial state of starting the loading process, the tape insertion detection sensor 45 is in an ON state (insertion of the supply tape has been completed) and the second tape detection sensor 74 and the first tape insertion sensor 75 are in an OFF state.

Next, the feeder control unit 40A drives the rear drive motor 50 to rotate the third sprocket 49, thereby causing the supply tape 80 to be carried from the first carrier route 62 to the main carrier route 61. Then, with the supply tape 80 pressurizing the pressurized protrusion 79 of the second tape detection sensor 74 downward and light between the paired detection units 77 being cut off by the tip of the lever 76, the second tape detection sensor becomes in an ON state, and it is detected that the supply tape 80 has entered the main carrier route 61.

Furthermore, when the supply tape 80 is carried as it is by the third sprocket 49, the feed holes 84 of the supply tape 80 fit to the teeth 47A of the second sprocket 47 when the supply tape 80 reaches the second sprocket 47. In the present embodiment, the second sprocket 47 starts rotation by being driven by the front drive motor 48 before the feed holes 84 and the teeth 47A fit, and the teeth 47 of the rotating second sprocket 47 fit in the feed holes 84 of the supply tape 80 being carried. However, rotation of the second sprocket 47 may be started simultaneously with the start of rotation of the third sprocket, or may be started of rotation by detection by the second tape detection sensor 74.

Then, when the supply tape 80 is carried as it is by the second sprocket 47 and the third sprocket 49 reaches the position of the first tape detection sensor 75, the leading edge of the supply tape 80 is detected by the first tape detection sensor 75, the rear drive motor 50 stops by being controlled by the feeder control unit 40A, and carrying of the supply tape 80 by the third sprocket 49 is stopped. Carrying of the supply tape 80 continues by the second sprocket 47.

Then, the feeder control unit 40A drives, for example, the front drive motor 48 for a predetermined time after the start of carrying of the supply tape 80 by the second sprocket 47, the insertion blade 71 of the exposure unit 70 enters between the carrier tape 81 and the cover tape 82 of the supply tape 80, and the electronic components E are exposed while the supply tape 80 passes though the exposure unit 70. Then, as depicted in FIG. 1 and FIG. 7, the teeth 46A of the first sprocket 46 fit in the feed holes 84 of the supply tape 80, and the leading edge of the supply tape 80 is arranged at a loading complete position where the leading edge reaches near the tip of the feeder main body 41. The loading complete position of the supply tape 80 is preferably a position where the component accommodating unit 83 where the electronic component E near the leading edge of the supply tape 80 is accommodated stops at the component suction position P1. Furthermore, the loading complete position of the supply tape 80 is preferably a position where the electronic component E accommodated in the component accommodating unit 83 at the leading edge of the supply tape 80 stops at the component suction position P1.

As described above, after the leading edge of the supply tape 80 passes through the first tape detection sensor 75, the supply tape 80 is carried by the first sprocket 46 and the second sprocket 47, and thus carrying of the supply tape 80 by the third sprocket 49 is stopped.

However, if a preceding tape 80A, which is a preceding supply tape, is disposed in the first carrier route 62, a subsequent tape 80B, which is a subsequent tape to be set after the preceding tape 80A, cannot be set.

For this reason, by performing a route change work of manually changing the carrier route of the preceding tape 80A from the first carrier route 62 to the second carrier route 63, the subsequent tape 80B can be set to the first carrier route 62. However, in order to perform the route change work, a worker who sets the subsequent tape 80B is required to wait until loading of the preceding tape 80A is completed. This is to prevent a possibility that, if the worker makes contact with the preceding tape 80A, holds the preceding tape 80A, or the like during loading operation, superfluous force is exerted onto the preceding tape 80A, such as pulling the preceding tape 80A, thereby bad affecting the loading operation. If the worker waits until loading is completed and the plurality of feeders 40 are installed in the component supply units 13, the route change work becomes burdensome, for example, the worker is required to check operation situations of each feeder 40. Also, if the route is changed from the first carrier route 62 to the second carrier route 63 during loading operation and before the preceding tape 80A fits to the second sprocket 47, carrying of the preceding tape 80A stops, and therefore the route is required to be changed always after the preceding tape 80A fits to the second sprocket 47.

Thus, in the loading process of the present embodiment, upon determination that the supply tape 80 has been arranged at a position of fitting to the second sprocket 47, a tape route automatic change process is automatically performed, not by the worker. The tape route automatic change process is performed in the loading process, and the tape route automatic change process may be performed after the supply tape 80 is arranged at the loading complete position at the tip of the feeder main body 41 and carrying of the supply tape 80 is stopped, or the tape route automatic change process may be performed in the course of carrying of the supply tape 80.

Figure 18:
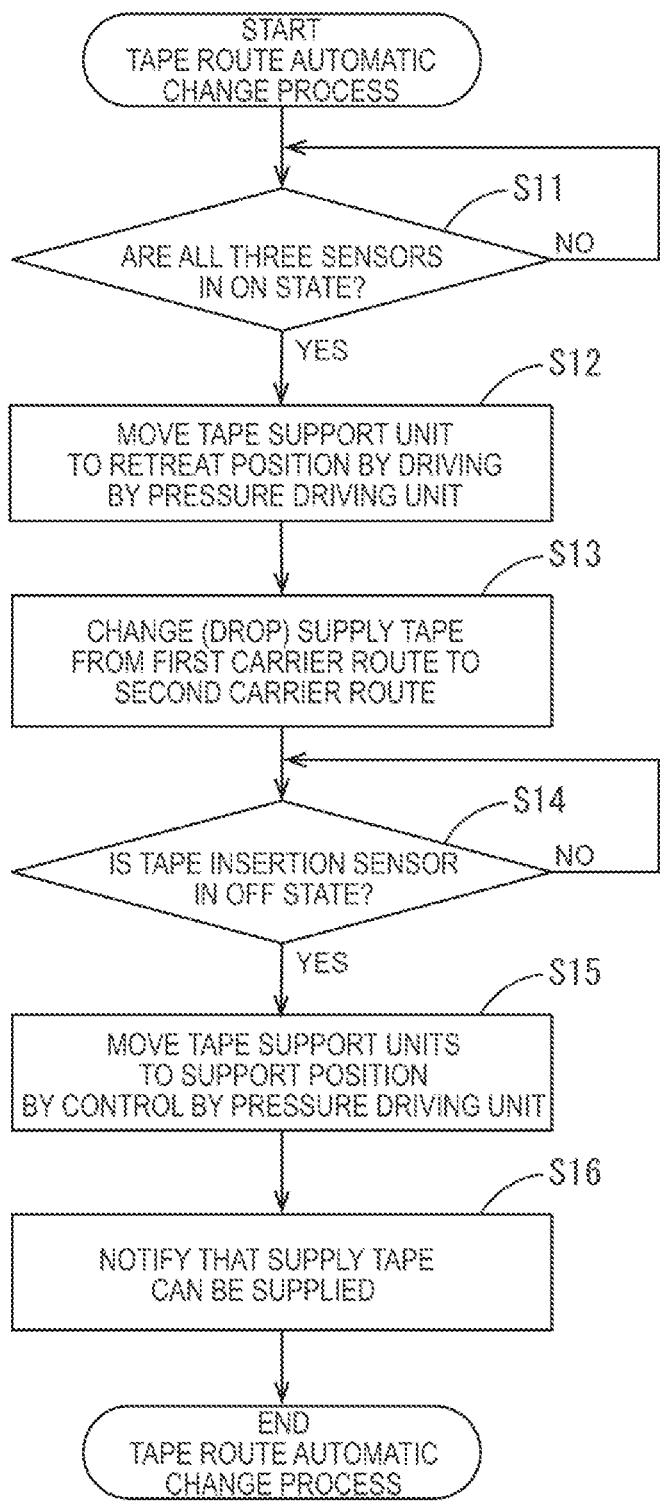
FIG. 18 is a flowchart view of a tape route automatic change process.

In the following, the tape route automatic change process is described with reference to a flowchart depicted in FIG. 18.

In the tape route automatic change process, as for the supply tape 80, with the tape insertion sensor 45, the second tape sensor 74, and the first tape detection sensor 75 all becoming in an ON state, the feeder control unit 40 first checks whether the supply tape 80 has been disposed from the first carrier route 62 to the tip of the feeder main body 41 of the main carrier route 61 (S11). If the three sensors 45, 74, and 75 are not all in an ON state (S11: NO), S11 is repeated until the three sensors 45, 74, and 75 all become in an ON state.

On the other hand, when the leading edge of the supply tape 80 goes over the second sprocket 47 and the first tape detection sensor 75 to cause the three sensors 45, 74, and 75 to all become in an ON state (S11: YES), the feeder control unit 40A drives the pressure driving unit 108 of the route switching device 103 in the loading unit 90.

Then, the pressurizing unit 105 is displaced by the cylinder unit 107 backward from the initial position to enter between the paired pressurized units 106 while the pressurizing unit 105 slides with the paired pressurized units 106, thereby causing the paired frame bodies 97 to be each displaced outward (S12), as depicted in FIG. 11B and FIG. 12B.

Then, when the pressurizing unit 105 reaches the final position, as depicted in FIG. 11C and FIG. 13C, the paired tape support units 99 in the paired frame bodies 97 reach the retreat position, thereby losing support of the supply tape 80 from below and causing the supply tape 80 to drop from the first carrier route 62 toward the second carrier route 63. This changes the carrier route of the supply tape 80 from the first carrier route 62 to the second carrier route 63 (S13).

Next, the feeder control unit 40 checks whether the tape insertion sensor 45 is switched from an ON state to an OFF state, with the supply tape 80 dropping from the first carrier route 62 to the second carrier route 63 to change the carrier route (S14). When the tape insertion sensor 45 is still in an ON state (S14: NO), monitoring continues until the tape insertion sensor 45 becomes in an OFF state.

On the other hand, with the supply tape 80 dropping from the first carrier route 62 to the second carrier route 63 to cause the tape insertion sensor 45 to become in an OFF state (S14: YES), the feeder control unit 40 pulls the pressure driving unit 108 back to move the cylinder unit 107 from the final position to the initial position. This causes the paired tape support units 99 in the paired frame bodies 97 to be pulled back to the support position by the pressing member 102 (S15), as depicted in FIG. 11D and FIG. 13D. When the tape insertion sensor 45 becomes in an OFF state (S14: YES), for example, a character "SP" indicating supply is lit and displayed on the display unit 43A on the operation panel 43 of the rear carrier unit 44 to notify that the supply tape 80 can be supplied (S16). As for the display indicating that the supply tape 80 can be supplied, a notification indicating supply capability may be presented not on the operation panel 43 of the feeder 40 but, for example, on a monitor of a main body provided to the surface-mounting machine 10, or a notification indicating supply capability may be displayed on the monitor of the main body together with the display of the operation panel 43.

That is, according to the tape route automatic change means of the present embodiment, with the tape insertion sensor 45 which detects that the tape has been inserted becoming in from an ON state to an OFF state, the paired tape support units 99 are displaced from the retreat position to the support position to allows the supply tape 80 to be supplied to the first carrier route 62. Also at the same time, a display can be made on the display unit 43A on the operation panel 43, indicating that the supply tape 80 can be supplied.

With this, as depicted in FIG. 5 and FIG. 9, the subsequent tape 80B can be set from the tape insertion position P2 onto the first carrier route 62 in the loading unit 90.

That is, after the supply tape 80 becomes able to be carried by the first sprocket 46 and the second sprocket 47 in the front carrier unit 42, the carrier route of the supply tape 80 is automatically changed from the first carrier route 62 to the second carrier route 63 without the worker performing work. Thus, the work by the worker waiting until loading is completed and then changing the route of the supply tape 80 can be abolished. Also, with the first carrier route 62 being vacant, the new supply tape 80 can be set at the tape insertion position P2.

Also in the present embodiment, to notify the worker that the carrier route of the supply tape 80 has been changed and a new supply tape 80 can be inserted, a notification indicating that the supply tape 80 can be supplied is lit and displayed on the display unit 43A on the operation panel 43 when the supply tape 80 drops from the first carrier route 62 to the second carrier route 63 to change the carrier route. This allows the worker to easily check a supply timing of the supply tape 80.

That is, since the worker can set the supply tape 80 at a convenient timing, tape replacement work can be made efficient, and work load on the worker can be reduced.

When the tape route automatic change process is performed after the front drive motor 48 in the front carrier unit 42 is stopped to stop carrying of the supply tape 80 to change the carrier route of the supply tape 80 from the first carrier route 62 to the second carrier route 63, the supply tape 80 can be inhibited from being unchanged from the first carrier route 62 to the second carrier route 63 because the supply tape 80 is being carried. On the other hand, when the tape route automatic change process is performed during carrying of the supply tape 80 to change the carrier route of the supply tape 80 from the first carrier route 62 to the second carrier route 63, the carrier route of the supply tape 80 can be easily changed from the first carrier route 62 to the second carrier route 63 by increasing tension on the supply tape 80.

Then, when suction mistakes by the mounting head 31 occur a predetermined times at the component suction position P1 after the trailing edge of the supply tape 80 is detected by the second tape detection sensor 74, depletion of components on the preceding tape 80A is determined, and the preceding tape 80A is discharged and also carrying of the subsequent tape 80B by the third sprocket 49 is started.

As has been described in the foregoing, according to the present embodiment, the loading unit 90 are provided with the pressing member 102 which attracts the paired frame bodies 97 to each other and presses them toward the support position and the route switching device 103 which displaces the paired frame bodies 97 against the pressing member 102 from the support position to the retreat position. Only by being caused by the pressurizing unit 105 in the route switching device 103 to enter between the paired pressurized units 106 in the paired frame bodies 97, the paired tape support units 99 in the paired frame bodies 97 are displaced to the lateral direction between the support position and the retreat position without work by the worker, and the carrier route can be changed from the first carrier route 62 to the second carrier route 63 by the self-weight of the supply tape 80. That is, for example, compared with a conventional case in which the worker lifts a portion in midstream of the supply tape to change the carrier route of the supply tape, tape replacement work can be made efficient, and work load on the worker can be reduced.

Also, according to the present embodiment, only by slightly displacing the paired tape support units 99 to the lateral direction, the carrier route of the supply tape 80 can be switched from the first carrier route 62 to the second carrier route 63. Thus, for example, compared with a case in which a tape support unit which supports the entire lower surface of the supply tape to the width direction, a displacement amount by which the tape support units 99 are displaced to the lateral direction can be decreased, and the feeder 40 can be configured as being compact.

Furthermore, according to the present embodiment, the paired frame bodies 97 are pressed by the pressing member 102 toward the support position, and the paired tape support units 99 can be automatically returned from the retreat position to the support position. Thus, for example, compared with a case in which the paired tape support units are manually returned from the retreat position to the support position, work load on the worker in work of replacing the supply tape 80 can be further reduced.

Second Embodiment

Next, a second embodiment is described with reference to FIGS. 19A to 19D.

In the second embodiment, the rear carrier unit 44 in the feeder 40 of the first embodiment is changed. Structures, operations, and effects common to the first embodiment are redundant and therefore description thereof is omitted. Also, the same symbols are used for the structures identical to those of the first embodiment.

In the second embodiment, as depicted in FIGS. 19B and 19C, a tape pressurizing unit 210 which pressurizes the supply tape 80 in the first carrier route 62 from above is provided on a side of the third sprocket 49.

The tape pressurizing unit 210 is controlled by a control program stored in the storage unit 112. When the paired frame bodies 97 are displaced from the support position to the retreat position to lose support of the supply tape 80 from below by the paired tape support units 99, as depicted in FIGS. 19B and 19C, the tape pressurizing unit 210 pressurizes the supply tape 80 from above, thereby causing the supply tape 80 in the first carrier route 62 to forcibly drop toward the second carrier route 63.

That is, according to the present embodiment, when support of the supply tape 80 by the paired tape support units 99 is lost, the tape pressurizing unit 210 pressurizes the supply tape 80 from above. Thus, the supply tape 80 can be prevented from not being changed from the first carrier route 62 to the second carrier route 63 because, for example, the supply tape is caught in the paired frame bodies or the third sprocket.

Third Embodiment

Next, a third embodiment is described with reference to FIGS. 20A to 20D.

In the third embodiment, the loading unit 90 of the first embodiment is changed. Structures, operations, and effects common to the first embodiment are redundant and therefore description thereof is omitted. Also, the same symbols are used for the structures identical to those of the first embodiment.

In a loading unit 390 of the third embodiment, the paired frame bodies 97 are respectively rotatably supported by paired shaft units (one example of a "rotation shaft") 310 extending to the front-and-back direction, which is the carrying direction of the supply tape 80, as depicted in FIGS. 20A to 20D. The paired shaft units 310 are provided so as to be aligned laterally slightly below a center portion of the paired frame bodies 97 in the vertical direction. The paired frame bodies 97 rotate by taking these shaft units 310 each as a fulcrum in a direction in which the paired tape support units 99 are away from each other.

The paired frame bodies 97 can rotate and be displaced between a support position depicted in FIG. 20A and a retreat position depicted in FIG. 20B. The paired frame bodies 97 are pressed by, for example, a coil spring not depicted and the like assembled to the shaft unit 310, from the retreat position toward the support position.

On an inner side surface 97A of one frame body 97 of the paired frame bodies 97, a support plate 311 is provided which protrudes toward the other frame body 97. This support plate 311 is disposed at a substantially center portion of the paired frame bodies 97 in the lateral direction at a substantially center portion of the paired frame bodies 97 in the vertical direction.

That is, upper protrusion end parts of the paired frame bodies 97 are the paired tape support units 99 as with the first embodiment to configure the first carrier route 62, and the support plate 311 provided to one frame body 97 configures the second carrier route 63 which supports the supply tape 80 dropping from the first carrier route 62 from below.

On the other hand, a route switching device 303 is configured to include a pressurizing unit 305 which pressurizes lower protrusion end parts of the paired frame bodies 97 from below, a cylinder unit 307 which supports the pressurizing unit 305, and a pressure driving unit 308 which moves the cylinder unit 307 to the vertical direction. In the tape route automatic change process in the loading process, when the leading edge of the supply tape 80 goes over the second sprocket 47 and the first tape detection sensor 75 to cause the three sensors 45, 74, and 75 to all become in an ON state, the feeder control unit 40A drives the pressure driving unit 308 of the route switching device 303 in the loading unit 390. Then, when the pressure driving unit 308 is driven, as depicted in FIG. 20B, the pressurizing unit 305 moves upward via the cylinder unit 307, and the pressurizing unit 305 pressurizes the lower protrusion end parts of the paired frame bodies 97. This causes the paired frame bodies 97 to rotate and causes the paired tape support units 99 to be displaced from the support position to the retreat position.

That is, also in the present embodiment, only by pressurizing the lower protrusion end parts of the paired frame bodies 97 by the pressure driving unit 308 to rotate the tape support units 99 to the retreat position, the carrier route of the supply tape 80 can be automatically changed with ease from the first carrier route 62 to the second carrier route 63 without route change work by the worker.

Fourth Embodiment

Next, a fourth embodiment is described with reference to FIGS. 21A to 21D.

The fourth embodiment is configured with one frame body 97 of the paired frame bodies 97 in the loading unit 90 of the third embodiment being omitted. Structures, operations, and effects common to the third embodiment are redundant and therefore description thereof is omitted. Also, the same symbols are used for the structures identical to those of the third embodiment.

A frame body 97 in a loading unit 940 of the fourth embodiment is formed of, as depicted in FIGS. 21A to 21D, only a single frame body 497 provided with the support plate 311, and the supply tape 80 is supported only by the upper tape support unit 99 in the single frame body 497 to configure the first carrier route 62.

In the tape route automatic change process in the loading process, as with the third embodiment, when the leading edge of the supply tape 80 goes over the second sprocket 47 and the first tape detection sensor 75 to cause the three sensors 45, 74, and 75 to all become in an ON state, the feeder control unit 40A drives the pressure driving unit 308 of the route switching device 303 and, as depicted in FIG. 21B, the pressurizing unit 305 pressurizes a lower protrusion end part of the single frame body 497, thereby displacing the tape support unit 99 from the support position to the retreat position.

That is, according to the present embodiment, only the single frame body 497 is rotated to displace the tape support unit 99 from the support position to the retreat position to allow the carrier route of the supply tape 80 to be switched from the first carrier route 62 to the second carrier route 63. Thus, the displacement amount of the tape support unit 99 to the lateral direction can be decreased, and the feeder 40 can be inhibited from becoming large.

Other Embodiment

The technology disclosed in the specification is not limited by the embodiments described above and the drawings and includes, for example, the following various modes.

(1) In the above-described embodiments, the structure is such that the front carrier unit 42 is provided with two sprockets, that is, the first sprocket 46 and the second sprocket 47. However, the structure is limited to this. The structure may be such that the front carrier unit is provided with one sprocket.

(2) In the above-described embodiments, the structure is such that the trailing edge of the supply tape 80 is detected by the first tape detection sensor 75 and depletion of components on the supply tape 80 is determined when suction mistakes by the mounting head 31 occur a predetermined number of times. However, the structure is limited to this. Depletion of components on the supply tape may be determined by detecting the trailing edge of the supply tape by the first tape detection sensor.

(3) In the above-described embodiments, the structure is such that carrying of the supply tape 80 is started by the third sprocket 49 when depletion of components on the supply tape 80 is determined. However, the structure is limited to this. The structure may be such that a stopper for temporarily stops carrying of the supply tape after carrying of the supply tape 80 by the third sprocket is started is provided inside the rear carrier unit and, when the trailing edge of the preceding tape is detected by the first tape detection sensor, the stopper is released and the supply tape is carried.

(4) In the above-described embodiments, the structure is such that the feeder 40 is controlled by the feeder control unit 40A. However, the structure is limited to this. The structure may be such that the control unit 110 of the surface-mounting machine 10 directly controls the feeders 40.

(5) In the above-described embodiments, the structure is such that, with the tape insertion sensor 45 being switched from an ON state to an OFF state, an indication in which the supply tape 80 can be supplied is displayed on the display unit 43A of the operation panel 43. However, the structure is limited to this. The structure may be such that an indication in which the supply tape can be supplied on the display unit on the operation panel after a lapse of a predetermined time after the pressure driving unit is driven if a tape insertion sensor is not provided, for example. Furthermore, if a tape insertion sensor is not provided, for example, driving of the pressure driving unit may be stopped after a lapse of a predetermined time after the pressure driving unit is driven to cause the tape support unit to become in a state of being capable of support the tape, thereby indicating that the supply tape can be supplied.

(6) In the above-described embodiments, the structure is such that the carrier route of the supply tape 80 is changed when the leading edge of the supply tape 80 goes over the second sprocket 47 and the first tape detection sensor 75. However, the structure is limited to this. It may be determined that final positioning of the supply tape by the first sprocket has been completed, that is, loading of the supply tape 80 has been completed to stop the supply tape 80, for example, to make a notification of route change or a notification indicating that the supply tape can be inserted.

The invention claimed is:

1. A component supply device configured to transfer a supply tape including components thereon, the component supplying device comprising:
   a body including a first section in which a component pick-up position is defined, and a second section including an opening for receiving the supply tape, and a middle section between the first section and the second section, the middle section including a flat top surface through which the supply tape is transferred;
   a first transfer mechanism disposed adjacent to the component pick-up position in the first section of the body;
   a second transfer mechanism disposed in a middle section of the body between the first section of the body and the second section of the body;
   a third transfer mechanism disposed adjacent to the opening in the second section of the body;
   a tape loading mechanism disposed under the third transfer mechanism, the tape loading mechanism comprising:
      a base attached to the second section of the body; and
      a tape carrier including a first member and a second member each having a C-beam shape and including bottom portions attached to the base, side portions extending upward from the bottom portions, and top portions extending from upper edges of the side portions toward each other and being opposed to the bottom portions to define an internal space, long edges of the top portions opposed to each other being separated from each other with a gap less than a width of the supply tape to hold side edges of the supply tape, respectively;
   a first sensor disposed in the first section of the body and configured to turn on in response to presence of a front end of the supply tape;
   a second sensor disposed in the middle section of the body between the second transfer mechanism and the third transfer mechanism and configured to turn on in response to presence of the supply tape on the middle section of the body;
   a third sensor disposed in the second section of the body adjacent to the third transfer mechanism and configured to turn on in response to presence of the supply tape on the tape carrier of the tape loading mechanism;
   a tape switching mechanism disposed adjacent to the tape loading mechanism, the tape switching mechanism comprising:
      a pressing portion opposed to the tape carrier; and
      a pressing portion driver connected to the pressing portion and configured to move the pressing portion; and
   a controller configured to:
      control the first transfer mechanism, the second transfer mechanism, and the third transfer mechanism to transfer the supply tape held with the top portions of the first member and the second member of the tape carrier in the second section of the body toward the first section of the body;
      determine whether the first sensor, the second sensor, and the third sensor turn on;
      in response to turn-on of the first sensor, the second sensor, and the third sensor, control the pressing portion driver to move the pressing portion from an initial position to a predefined position at which the tape carrier is pressed and the gap becomes greater than the width of the supply tape and the supply tape falls into the internal space of the tape carrier;
      determine whether the third sensor turns off; and
      in response to turn-off of the third sensor, control the pressing portion driver to move the pressing portion back to the initial position.

2. The component supply device according to claim 1, wherein
   the tape switching mechanism is disposed between the tape loading mechanism and the second transfer mechanism,
   the bottom portions of the first member and the second member of the tape carrier are separated from each other with a gap between linear long edges of the bottom portions opposed to each other,
   the gap between the linear long edges of the bottom portions is less than the gap between the long edges of the top portions of the first member and the second member,
   the bottom portions include angled edges extending from the linear long edges to ends of the bottom portions adjacent to the tape switching mechanism at angles to be separated from each other toward the ends,
   the pressing portion of the tape switching mechanism includes:
      a columnar portion having a diameter greater than the gap between the linear long edges of the bottom portions and including a section disposed between the angled edges of the bottom portion; and
      a cylinder portion having an elongated shape and being extendable, the cylinder portion being coupled to the columnar portion and the pressing portion driver, and
   the controller is configured to:
      control the pressing portion driver to extend the cylinder portion to move the columnar portion toward the gap between the linear long edges of the bottom portions to the predefined position; and
      control the pressing portion drive to restore the cylinder portion to move the columnar portion from the predefined position to the initial position.

3. The component supply device according to claim 2, wherein
   the tape loading mechanism includes an elastic member between ends of the first member and the second member on an opposite side from the tape switching mechanism.

4. The component supply device according to claim 2, wherein
   the second section of the body includes a sloped surface sloped from the flat top surface of the middle section to the tape loading mechanism, and
   the tape switching mechanism is disposed under the sloped surface.

5. The component supply device according to claim 1, further comprising at least one elastic member attached to the base of the tape loading mechanism, wherein the second section of the body includes a holding space under the third transfer mechanism in which the tape loading mechanism and the tape switching mechanism are disposed, and the at least one elastic member is attached to the bottom of the base of the tape loading mechanism and a bottom wall of the holding space.

6. The component supply device according to claim 5, wherein the base includes a base plate having an elongate plate shape and a base body having a block shape, the base body has a length less than a length of the base plate and a height about equal to a height of the pressing portion driver, the tape carrier is disposed on the base body, the pressing portion driver is disposed on a first plate surface of the base plate opposed to the tape carrier, and the at least one elastic member is attached to a second plate surface of the base plate opposed to the bottom wall of the holding space.

7. The component supply device according to claim 1, wherein in response to turn-on of the first sensor, the controller is configured to stop the third transfer mechanism.

8. The component supply device according to claim 1, further comprising a display disposed adjacent to the third transfer mechanism, wherein the controller is configured to, in response to the turn-off of the third sensor, control the display to display a notification that another supply tape can be supplied.

9. The component supply device according to claim 1, wherein the controller is configured to:
  determine whether the second sensor turns off;
  in response to turn-off of the second sensor, control the third transfer mechanism to transfer another supply tape disposed from the second section of the body to the first section of the body.

10. The component supply device according to claim 1, further comprising a tape pushing member adjacent to the third transfer mechanism and opposed to the supply tape from above to push the supply tape when the pressing portion is moved from the initial position to the predefined position.

11. The component supply device according to claim 1, wherein the tape switching mechanism is disposed under the tape loading mechanism, the tape loading mechanism includes a first shaft, a second shaft, and a shaft holder, the first shaft and the second shaft extend along the long edges of the top portion of the first member and the second member of the tape carrier, the shaft holder is attached to the first member and the second member, the first shaft is held by the shaft holder holds to be rotatable about the first shaft, the second shaft is held by the shaft holder holds to be rotatable about the second shaft, the bottom portions of the first member and the second member of the tape carrier are separated from each other with a gap between linear long edges of the bottom portions opposed to each other, the gap between the long edges of the bottom portions is less than the gap between the long edges of the top portions of the first member and the second member, the pressing portion of the tape switching mechanism includes:
  a columnar portion having a diameter greater than the gap between the long edges of the bottom portions and disposed adjacent to the bottom portions; and
  a cylinder portion having an elongated shape and being extendable, the cylinder portion being coupled to the columnar portion and the pressing portion driver, and the controller is configured to:
  control the pressing portion driver to extend the cylinder portion to move the columnar portion toward the gap between the linear edges of the bottom portions to the predefined position; and
  control the pressing portion drive to restore the cylinder portion to move the columnar portion from the predefined position to the initial position.

* * * * *